(12) United States Patent
Yoshimizu et al.

(10) Patent No.: US 10,319,734 B2
(45) Date of Patent: Jun. 11, 2019

(54) SEMICONDUCTOR MEMORY DEVICE HAVING AIR GAP

(71) Applicant: Toshiba Memory Corporation, Tokyo (JP)

(72) Inventors: Yasuhito Yoshimizu, Mie (JP); Akifumi Gawase, Mie (JP); Kei Watanabe, Mie (JP); Shinya Arai, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/001,991

(22) Filed: Jan. 20, 2016

(65) Prior Publication Data

US 2017/0062459 A1    Mar. 2, 2017

(30) Foreign Application Priority Data

Aug. 26, 2015  (JP) ................... 2015-166575

(51) Int. Cl.
*H01L 27/11582*  (2017.01)
*H01L 21/764*  (2006.01)
*H01L 23/532*  (2006.01)

(52) U.S. Cl.
CPC ...... *H01L 27/11582* (2013.01); *H01L 21/764* (2013.01); *H01L 23/53295* (2013.01)

(58) Field of Classification Search
CPC .............................................. H01L 27/11582
USPC ....................................................... 257/324
See application file for complete search history.

(56) References Cited

U.S. PATENT DOCUMENTS

| 7,847,334 | B2 | 12/2010 | Katsumata et al. |
|---|---|---|---|
| 7,927,926 | B2 | 4/2011 | Katsumata et al. |
| 8,581,330 | B2 | 11/2013 | Kiyotoshi |
| 2009/0242967 | A1 | 10/2009 | Katsumata et al. |
| 2010/0207193 | A1 | 8/2010 | Tanaka et al. |
| 2011/0033995 | A1 | 2/2011 | Katsumata et al. |
| 2012/0052674 | A1* | 3/2012 | Lee ............... H01L 27/11578 438/591 |
| 2013/0032873 | A1 | 2/2013 | Kiyotoshi |

(Continued)

FOREIGN PATENT DOCUMENTS

| JP | 2012-089587 | 5/2012 |
|---|---|---|
| TW | 201322334 | 6/2013 |
| TW | 201351617 A | 12/2013 |

*Primary Examiner* — Hsin Yi Hsieh
(74) *Attorney, Agent, or Firm* — Finnegan, Henderson, Farabow, Garrett & Dunner, L.L.P.

(57) ABSTRACT

According to one embodiment, a semiconductor device includes a substrate, a stacked body, a second air gap, a first insulating film, a semiconductor film, and a stacked film. The stacked body is provided above the substrate and includes a plurality of electrode films stacked via a first air gap. The second air gap extends in a stacking direction of the stacked body. The second air gap separates the stacked body in a first direction crossing the stacking direction. The first insulating film is provided above the stacked body and covers an upper end of the second air gap. The stacked film is provided between a side surface of the electrode film and a side surface of the semiconductor film opposed to the side surface of the electrode film. The stacked film is in contact with the side surface of the electrode film and the side surface of the semiconductor film.

7 Claims, 33 Drawing Sheets

(56) References Cited

U.S. PATENT DOCUMENTS

2013/0320424 A1 12/2013 Lee et al.
2014/0252443 A1 9/2014 Kawai et al.

* cited by examiner

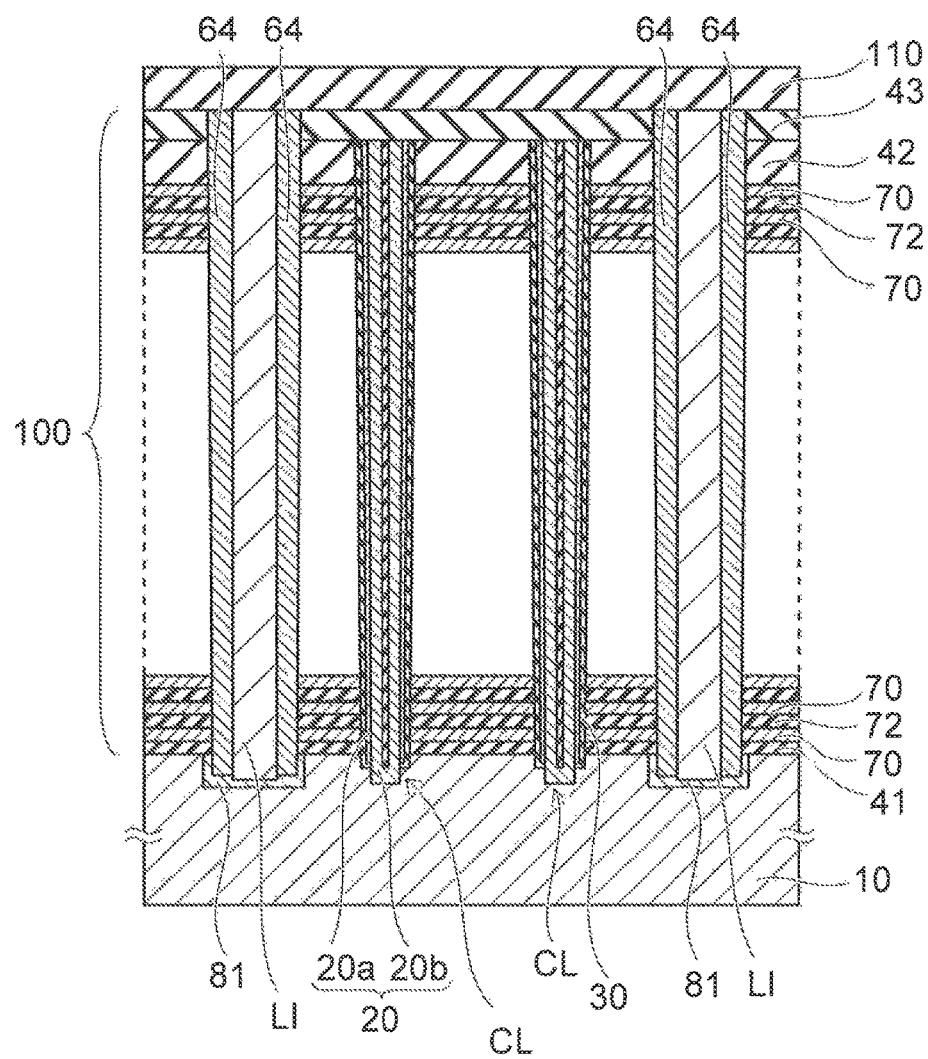

SEMICONDUCTOR MEMORY DEVICE HAVING AIR GAP

CROSS-REFERENCE TO RELATED APPLICATION

This application is based upon and claims the benefit of priority from Japanese Patent Application No. 2015-166575, filed on Aug. 26, 2015; the entire contents of which are incorporated herein by reference.

FIELD

Embodiments described herein relate generally to a semiconductor device and a method for manufacturing the same.

BACKGROUND

As a structure of the three-dimensional memory device including a plurality of electrode films stacked on a substrate, it has been proposed to provide an air gap between the vertically adjacent electrode films. There is concern about the decrease of breakdown voltage between the electrode films with the narrowing of the spacing between the electrode films opposed across the air gap.

BRIEF DESCRIPTION OF THE DRAWINGS

FIG. 25A is a schematic top view showing the method for manufacturing the semiconductor device of the second embodiment, and FIG. 25B is a schematic sectional view showing the method for manufacturing the semiconductor device of the second embodiment;

DETAILED APPLICATION

Figure 1:
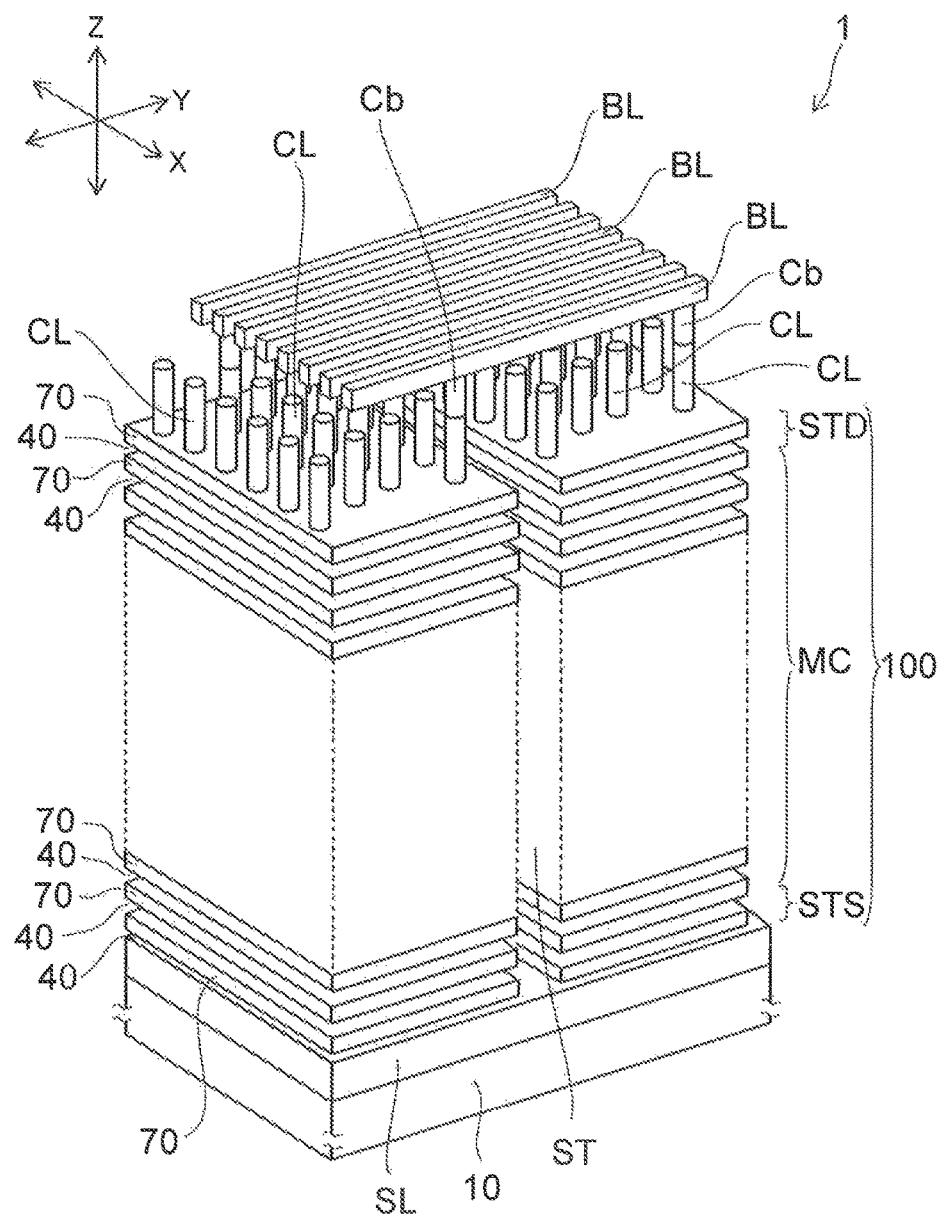
FIG. 1 is a schematic perspective view of a semiconductor device of a first embodiment.

According to one embodiment, a semiconductor device includes a substrate, a stacked body, a second air gap, a first insulating film, a semiconductor film, and a stacked film. The stacked body is provided above the substrate and includes a plurality of electrode films stacked via a first air gap. The second air gap extends in a stacking direction of the stacked body. The second air gap separates the stacked body in a first direction crossing the stacking direction. The second air gap communicates with the first air gap. The first insulating film is provided above the stacked body and covers an upper end of the second air gap. The semiconductor film extends in the stacking direction in the stacked body. The stacked film includes a charge storage portion. The stacked film is provided between a side surface of the electrode film and a side surface of the semiconductor film opposed to the side surface of the electrode film. The stacked film is in contact with the side surface of the electrode film and the side surface of the semiconductor film.

Embodiments will now be described with reference to the drawings. In the drawings, like elements are labeled with like reference numerals.

In the embodiments, a semiconductor memory device including a memory cell array of the three-dimensional structure is described as an example of the semiconductor device.

FIG. 1 is a schematic perspective view of the memory cell array 1 of a first embodiment.

In FIG. 1, two directions parallel to the major surface of the substrate 10 and orthogonal to each other are referred to as X-direction and Y-direction. The direction orthogonal to both the X-direction and the Y-direction is referred to as Z-direction (stacking direction).

As shown in FIG. 1, the memory cell array 1 includes a substrate 10, a source layer SL provided on the substrate 10, a stacked body 100 provided on the source layer SL, a plurality of columnar parts CL, and a plurality of bit lines BL provided above the stacked body 100.

The substrate 10 is e.g. a silicon substrate. The bit line BL and the source layer SL have conductivity. An insulating layer may be provided between the substrate 10 and the source layer SL.

A slit (second air gap) ST is formed in the stacked body 100. The slit ST extends in the stacking direction (Z-direction) to the source layer SL. Furthermore, the slit ST extends in the X-direction and separates the stacked body 100 into a plurality of blocks in the Y-direction.

The columnar part CL is formed like a circular column or elliptical column extending in the stacking direction (Z-direction) in the stacked body 100.

The plurality of columnar parts CL are arranged in e.g. a staggered arrangement. Alternatively, the plurality of columnar parts CL may be arranged in a square lattice along the X-direction and the Y-direction.

The bit lines BL are separated from each other in the X-direction. Each bit line BL extends in the Y-direction.

The upper end of the semiconductor film 20, described later, of the columnar part CL is connected to the bit line BL through a contact part Cb. The plurality of columnar parts CL, each of which is selected from each of blocks separated in the Y-direction by the slit ST, are connected to one common bit line BL.

Figure 2:
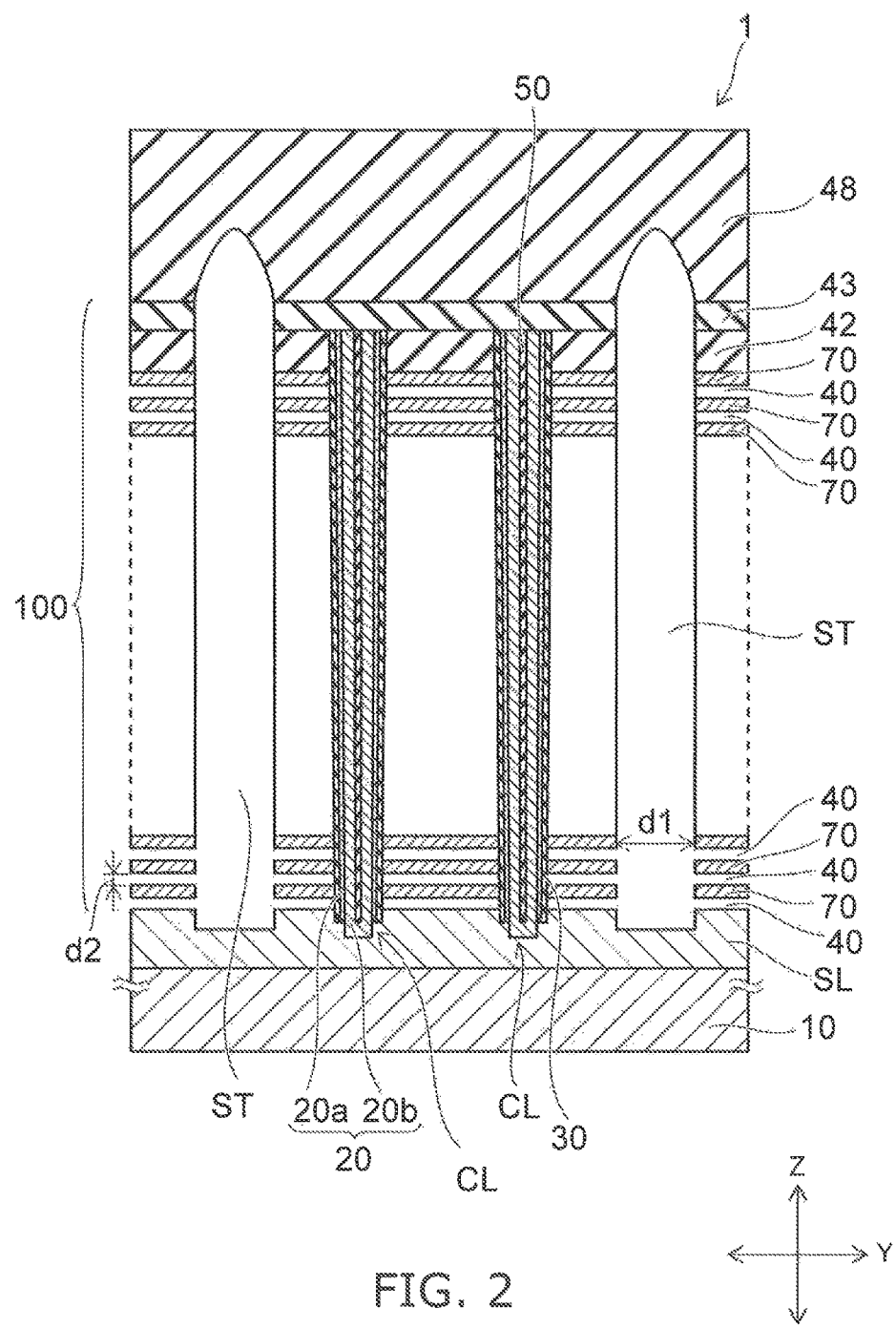
FIG. 2 is a schematic sectional view of the semiconductor device of the first embodiment.

FIG. 2 is a schematic sectional view of the memory cell array 1. The Y-direction and the Z-direction shown in FIG. 2 correspond to the Y-direction and the Z-direction shown in FIG. 1, respectively.

The insulating films 42, 43, 48 shown in FIG. 2 are not shown in FIG. 1.

The stacked body 100 includes a plurality of electrode films 70 stacked on the substrate 10 via the source layer SL. The plurality of electrode films 70 are stacked in the direction (Z-direction) perpendicular to the major surface of the substrate 10 at a prescribed pitch via an air gap (first air gap) 40. The electrode film 70 contains metal or metal silicide.

The air gap 40 is formed between the electrode films 70 adjacent in the stacking direction. The air gap 40 is formed also between the source layer SL and the lowermost electrode film 70.

An insulating film 42 is provided on the uppermost electrode film 70. An insulating film 43 is provided on the insulating film 42. The uppermost electrode film 70 is in contact with the insulating film 42.

Figure 3:
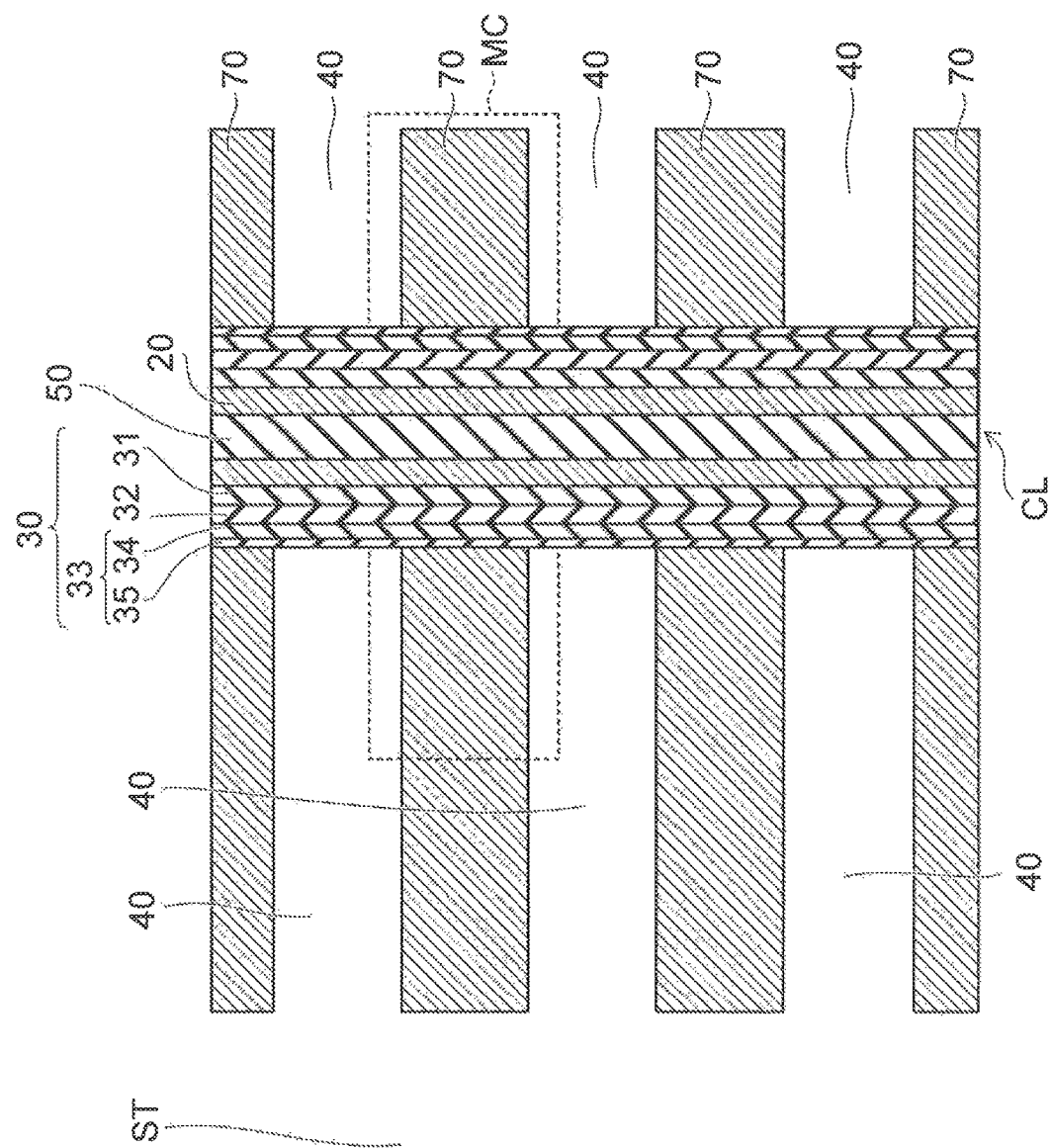
FIG. 3 is a partially enlarged sectional view of FIG. 2.

FIG. 3 is a partially enlarged sectional view of FIG. 2.

The columnar part CL is a stacked film including a memory film 30, a semiconductor film 20, and an insulating core film 50. The semiconductor film 20 extends like a pipe in the stacking direction (Z-direction) in the stacked body 100. The memory film 30 is provided between the electrode film 70 and the semiconductor film 20. The memory film 30 surrounds the semiconductor film 20 from the outer peripheral side. The core film 50 is provided inside the pipe-shaped semiconductor film 20.

The upper end of the semiconductor film 20 is connected to the bit line BL through the contact part Cb shown in FIG. 1. The lower end of the semiconductor film 20 is connected to the source layer SL as shown in FIG. 2.

The memory film 30 includes a tunnel insulating film 31, a charge storage film (a charge storage portion) 32, and a block insulating film 33. The block insulating film 33, the charge storage film 32, the tunnel insulating film 31, and the semiconductor film 20 extend continuously in the stacking direction of the stacked body 100. The block insulating film 33, the charge storage film 32, and the tunnel insulating film 31 are provided sequentially from the electrode film 70 side between the electrode film 70 and the semiconductor film 20. The tunnel insulating film 31 is in contact with the semiconductor film 20. The block insulating film 33 is in contact with the electrode film 70. The charge storage film 32 is provided between the block insulating film 33 and the tunnel insulating film 31.

The semiconductor film 20, the memory film 30, and the electrode film 70 constitute a memory cell MC. In FIG. 3, one memory cell MC is schematically shown by a dashed line. The memory cell MC has a vertical transistor structure in which the electrode film 70 surrounds the semiconductor film 20 via the memory film 30.

In the memory cell MC of the vertical transistor structure, the semiconductor film 20 functions as a channel. The electrode film 70 functions as a control gate. The charge storage film 32 functions as a data storage layer for storing charge injected from the semiconductor film 20.

The semiconductor memory device of the embodiment is a nonvolatile semiconductor memory device capable of electrically and freely erasing/writing data and retaining its memory content even when powered off.

The memory cell MC is e.g. a charge trap type memory cell. The charge storage film 32 includes a large number of trap sites for trapping charge in the insulating film. The charge storage film 32 includes e.g. a silicon nitride film.

The tunnel insulating film 31 serves as a potential barrier when charge is injected from the semiconductor film 20 into the charge storage film 32, or when the charge stored in the charge storage film 32 is released into the semiconductor film 20. The tunnel insulating film 31 includes e.g. a silicon oxide film.

The block insulating film 33 prevents the charge stored in the charge storage film 32 from releasing into the electrode film 70. The block insulating film 33 suppresses back tunneling of electrons from the electrode film 70 at the time of erase operation.

The block insulating film 33 includes a first block film 34 and a second block film 35. The first block film 34 is e.g. a silicon oxide film, and is in contact with the charge storage film 32. The second block film 35 is provided between the first block film 34 and the electrode film 70, and is in contact with the electrode film 70.

The second block film 35 is a film having higher dielectric constant than silicon oxide film. The second block film 35 is e.g. a metal oxide film. The second block film 35 is e.g. an aluminum oxide film or hafnium oxide film.

The memory film 30 is provided between the side surface on the columnar part CL side of the electrode film 70 and the side surface of the semiconductor film 20 opposed to the side surface of the electrode film 70. The memory film 30 is in contact with the side of the electrode film 70 and the side surface of the semiconductor film 20. The side surface on the air gap 40 side of the semiconductor film 20 is not exposed to the air gap 40, but covered and protected with the memory film 30.

Between the side surface of the electrode film 70 and the side surface of the semiconductor film 20, the films are continuously provided in the direction connecting these side surfaces. The plurality of electrode films 70 stacked via the air gap 40 are physically connected to the columnar part CL and supported by the columnar part CL.

As shown in FIG. 1, a drain side select transistor STD is provided in the upper end part of the columnar part CL. A source side select transistor STS is provided in the lower end part of the columnar part CL. For instance, the lowermost electrode film 70 functions as a control gate of the source side select transistor STS. For instance, the uppermost electrode film 70 functions as a control gate of the drain side select transistor STD.

As shown in FIG. 1, a plurality of memory cells MC are provided between the drain side select transistor STD and the source side select transistor STS. The memory cells MC, the drain side select transistor STD, and the source side select transistor STS are series connected through the semiconductor film 20 and constitute one memory string. Such memory strings are arranged in e.g. a staggered arrangement in the plane direction parallel to the X-Y plane. The memory cells MC are provided three-dimensionally in the X-direction, the Y-direction, and the Z-direction.

As described later, the air gap 40 between the electrode films 70 is formed by removing a sacrificial film formed between the electrode films 70 by etching through the slit ST.

Then, as shown in FIG. 2, an insulating film 48 is formed on the insulating film 43 to cover the upper end of the slit ST. A film formation method with relatively low coverage such as chemical vapor deposition (CVD) technique is selected as the method for forming the insulating film 48. Thus, the insulating film 48 is not buried in the slit ST.

The upper end of the slit ST is occluded in the state in which an air gap communicating with the air gap 40 between the electrode films 70 is left below the uppermost electrode film 70. The opening on the slit ST side of the air gap 40 between the electrode films 70 is not covered with the insulating film 48.

In the example shown in FIG. 2, the slit ST penetrates through the insulating films 42, 43 above the upper surface of the uppermost electrode film 70, and extends into the insulating film 48.

Figure 17:
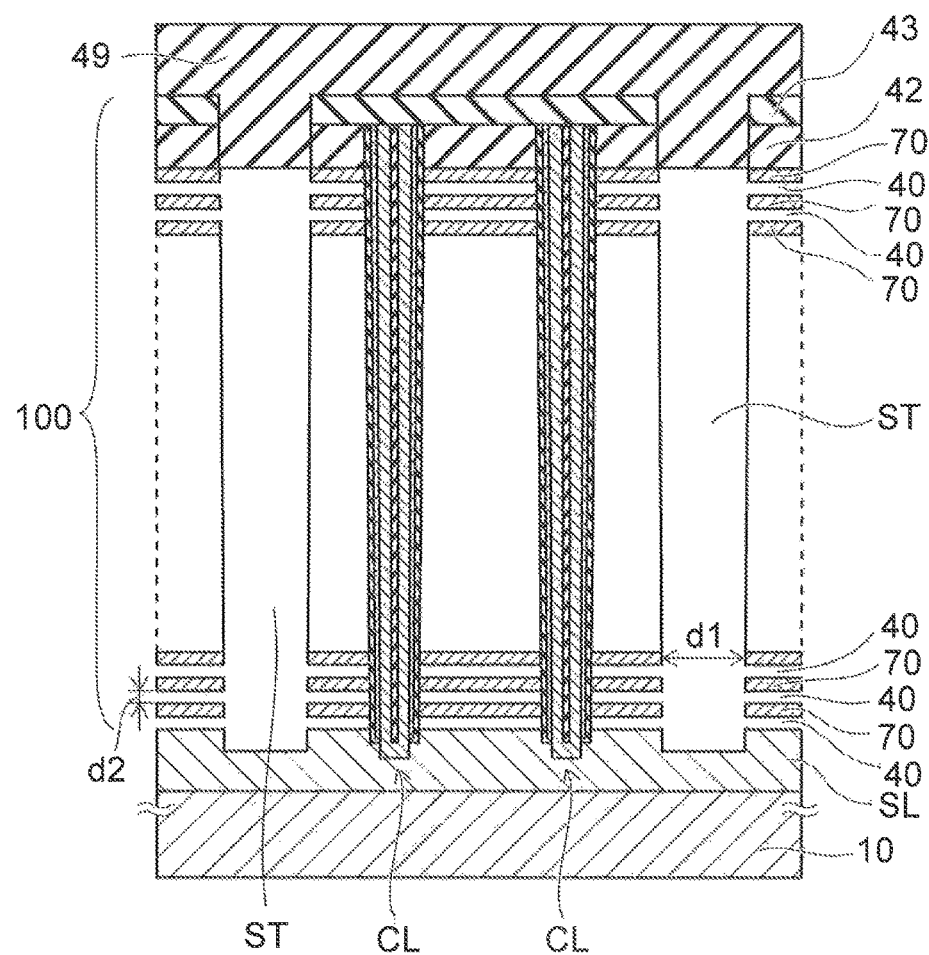

Alternatively, as shown in FIG. 17, a part of the insulating film 49 formed on the insulating film 43 may extend into a part of the slit ST on the upper end side. The upper end of the slit ST is configured not to be occluded with the insulating film 49 below the lower surface of the insulating film 42. The opening on the slit ST side of the air gap 40 between the electrode films 70 is configured not to be covered with the insulating film 49.

The spacing d1 between the electrode films 70 opposed in the Y-direction across the slit ST is larger than the spacing d2 between the electrode films 70 adjacent in the stacking direction (Z-direction) via the air gap 40. The spacing d1 between the electrode films 70 in the Y-direction is equivalent to the Y-direction width of the slit ST.

According to the embodiment, the air gap 40 is formed between the control gates (electrode films 70) of the memory cells MC adjacent in the stacking direction (Z-direction). This can reduce the interconnect capacitance between the vertically adjacent electrode films 70 and enables fast operation of the memory cell MC. Furthermore, this can suppress interference between adjacent cells such as threshold variation due to capacitive coupling between the vertically adjacent electrode films 70.

As a structure different from that of the embodiment, the following structure may be considered. An insulating film may be buried in the slit ST with the air gap 40 left between the electrode films 70. Alternatively, an insulating film may be formed on the sidewall of the slit ST. In this structure, the opening on the slit ST side of the air gap 40 is occluded with the insulating film. In this structure, when the spacing between the vertically adjacent electrode films 70 is made narrower, the creepage distance between the vertically adjacent electrode films 70 along the surface of the insulating film formed in the end part on the slit ST side of the air gap 40 is also made shorter.

A higher memory cell density requires increasing the number of stacked layers of the electrode films 70. Furthermore, it is desirable to suppress the increase of the thickness of the overall stacked body 100 from the viewpoint of facilitating processing the stacked body 100. Thus, narrowing of the spacing between the electrode films 70 adjacent in the stacking direction is also required with the increase of the number of stacked layers of the electrode films 70.

Such narrowing of the spacing between the electrode films 70 decreases the creepage distance along the surface of the aforementioned insulating film. This increases the possibility of current leakage between the electrode films 70 such as migration along the surface of the insulating film.

In contrast, according to the embodiment, no insulating film is formed in the end part on the slit ST side of the air gap 40. The air gap 40 between the electrode films 70 is integrally connected to the slit ST. This can ensure high breakdown voltage between the electrode films 70 adjacent in the stacking direction via the air gap 40.

Furthermore, in the example shown in FIG. 2, the upper end of the air gap 40 extends into the insulating films 42, 43, 48 above the upper surface of the uppermost electrode film 70. Thus, the creepage distance along the surface of the insulating films 42, 43, 48 between the uppermost electrode films 70 opposed across the slit ST is larger than the Y-direction width of the slit ST. This can reduce the possibility of short circuit through the surface of the insulating film on the slit ST between the uppermost electrode films 70 opposed across the slit ST.

Furthermore, the spacing d1 between the electrode films 70 opposed in the Y-direction across the slit ST is larger than the spacing d2 between the electrode films 70 adjacent in the stacking direction via the air gap 40.

As shown in FIG. 17, the surface (lower surface) of part of the insulating film 49 occluding the upper end of the slit ST may be located near the upper surface of the uppermost electrode film 70. Even in this case, the creepage distance between the uppermost electrode films 70 along the surface of the insulating film 49 can be made larger than the spacing d2 between the vertically adjacent electrode films 70. This can prevent short circuit through the surface of the insulating film 49 between the uppermost electrode films 70.

Next, a method for manufacturing the memory cell array 1 of the first embodiment is described with reference to FIGS. 4 to 16.

Figure 4:
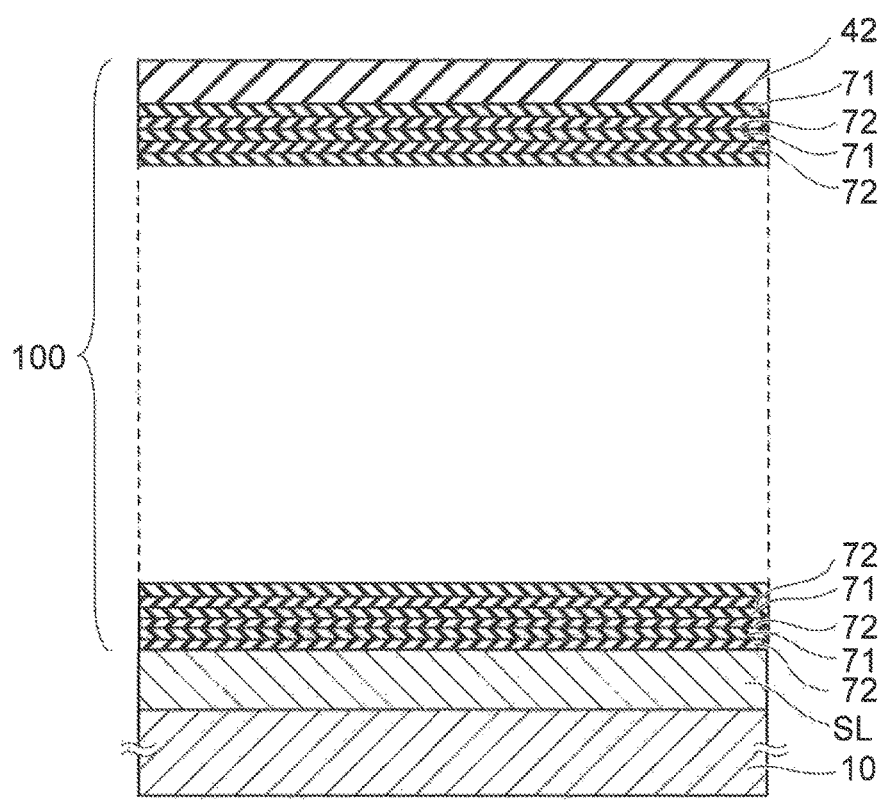
FIGS. 4 to 17 are schematic sectional views showing a method for manufacturing the semiconductor device of the first embodiment.

As shown in FIG. 4, a source layer SL is formed on a substrate 10. A stacked body 100 is formed on the source layer SL.

A second sacrificial film 72 is formed on the surface of the source layer SL. A first sacrificial film 71 is formed on the second sacrificial film 72. This is followed by repeating the step of alternately stacking one second sacrificial film 72 and one first sacrificial film 71. For instance, the first sacrificial film 71 is a silicon nitride film. The second sacrificial film 72 is a silicon oxide film.

An insulating film 42 is formed on the uppermost first sacrificial film 71. The uppermost first sacrificial film 71 is formed between the uppermost second sacrificial film 72 and the insulating film 42.

Figure 5:
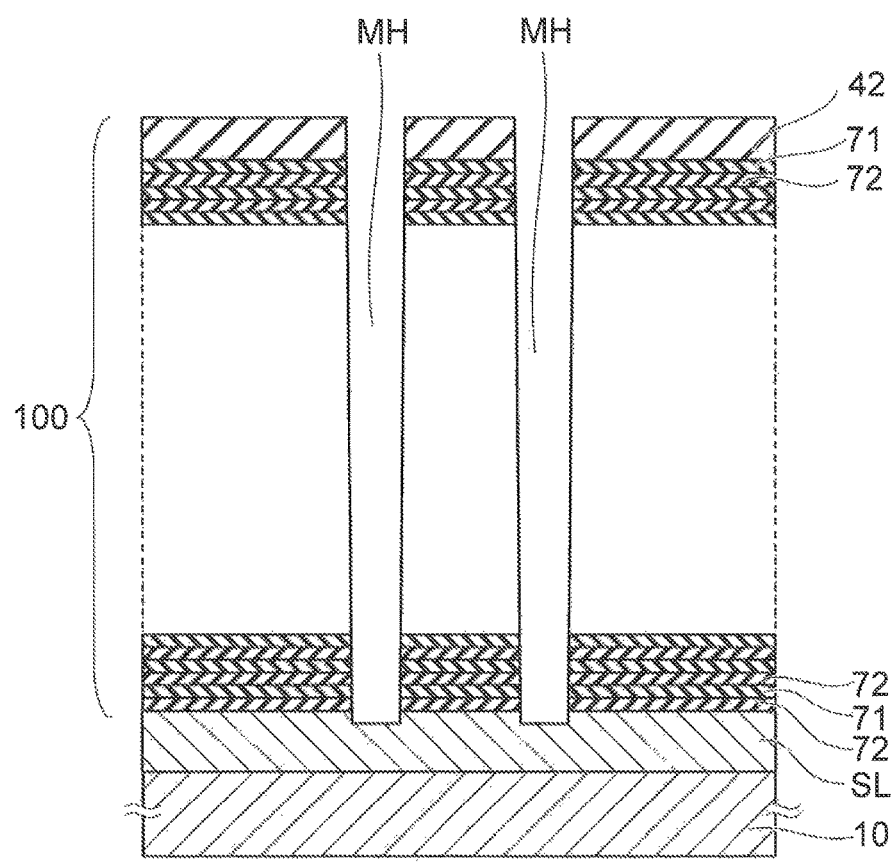

Next, as shown in FIG. 5, a plurality of memory holes MH are formed in the stacked body 100. The stacked body 100 includes the first sacrificial films 71, the second sacrificial films 72, and the insulating film 42. The memory holes MH are formed by RIE technique using a mask, not shown. The memory hole MH penetrates through the stacked body 100 to the source layer SL.

The plurality of first sacrificial films (silicon nitride films) 71 and the plurality of second sacrificial films (silicon oxide films) 72 are continuously etched by RIE technique using e.g. a fluorine-containing gas without switching the gas. This enables formation of a memory hole MH with a good shape at high throughput.

Figure 6:
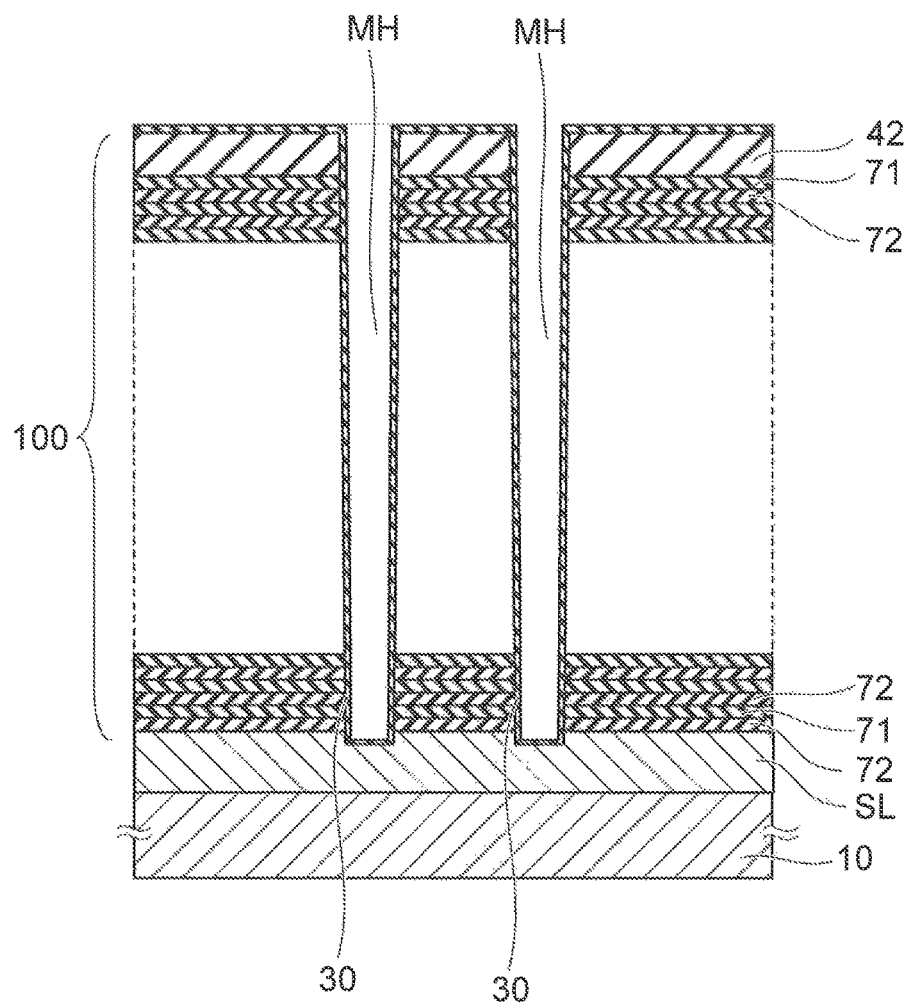
Figure 7:
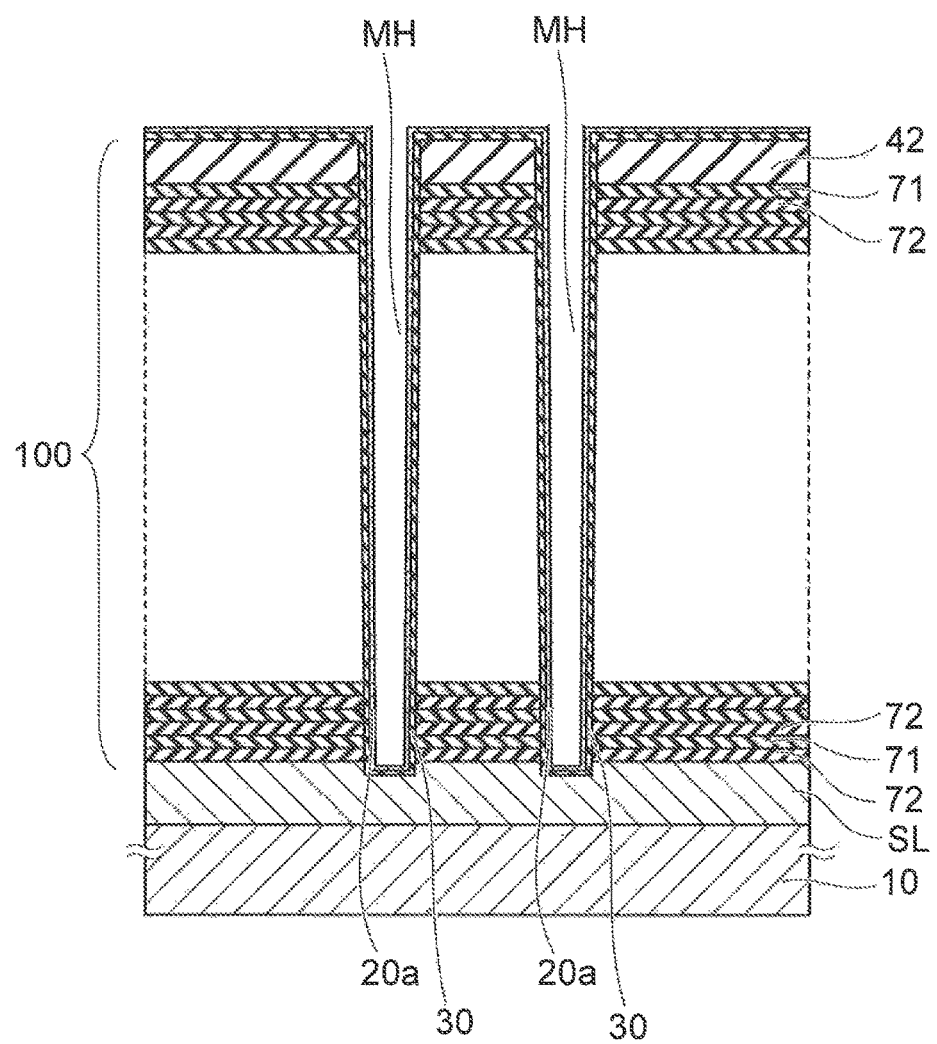

As shown in FIG. 6, a memory film 30 is formed on the side surface and bottom of the memory hole MH. As shown in FIG. 7, a cover film 20a is formed inside the memory film 30.

Figure 8:
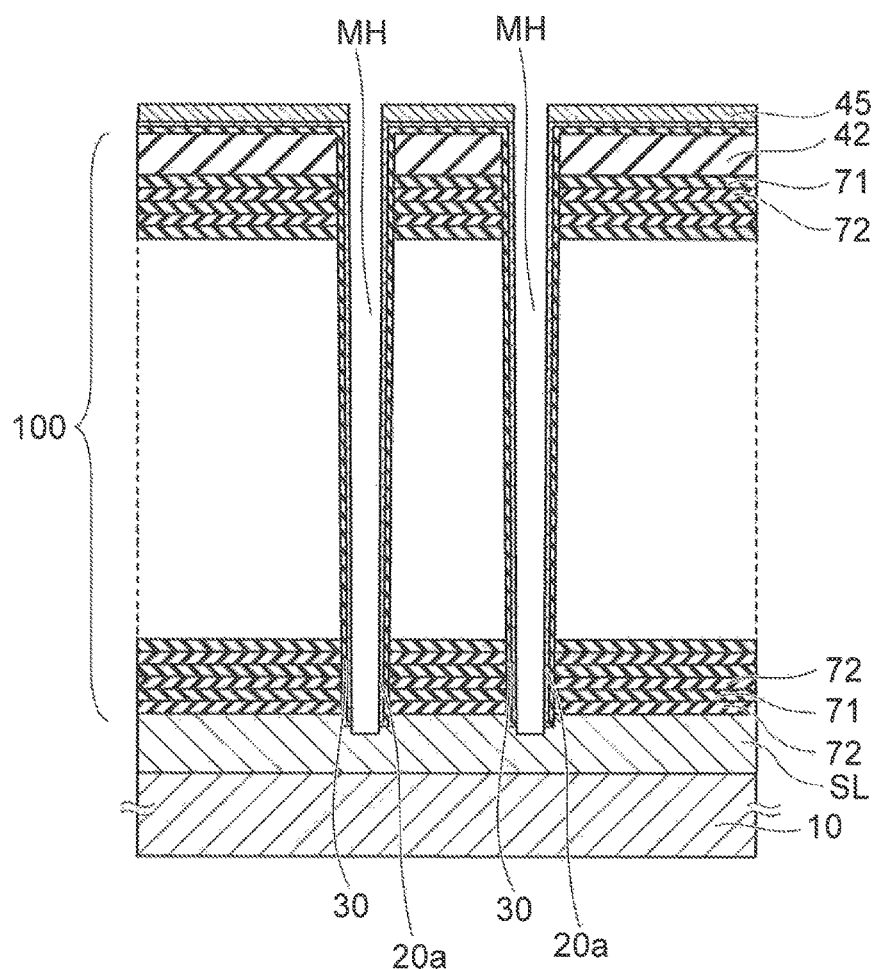

As shown in FIG. 8, a mask layer 45 is formed on the upper surface of the stacked body 100. The cover film 20a and the memory film 30 formed at the bottom of the memory hole MH are removed by RIE technique. At the time of this RIE, the memory film 30 formed on the side surface of the memory hole MH is covered and protected with the cover film 20a. Thus, the memory film 30 formed on the side surface of the memory hole MH is not damaged by RIE.

Figure 9:
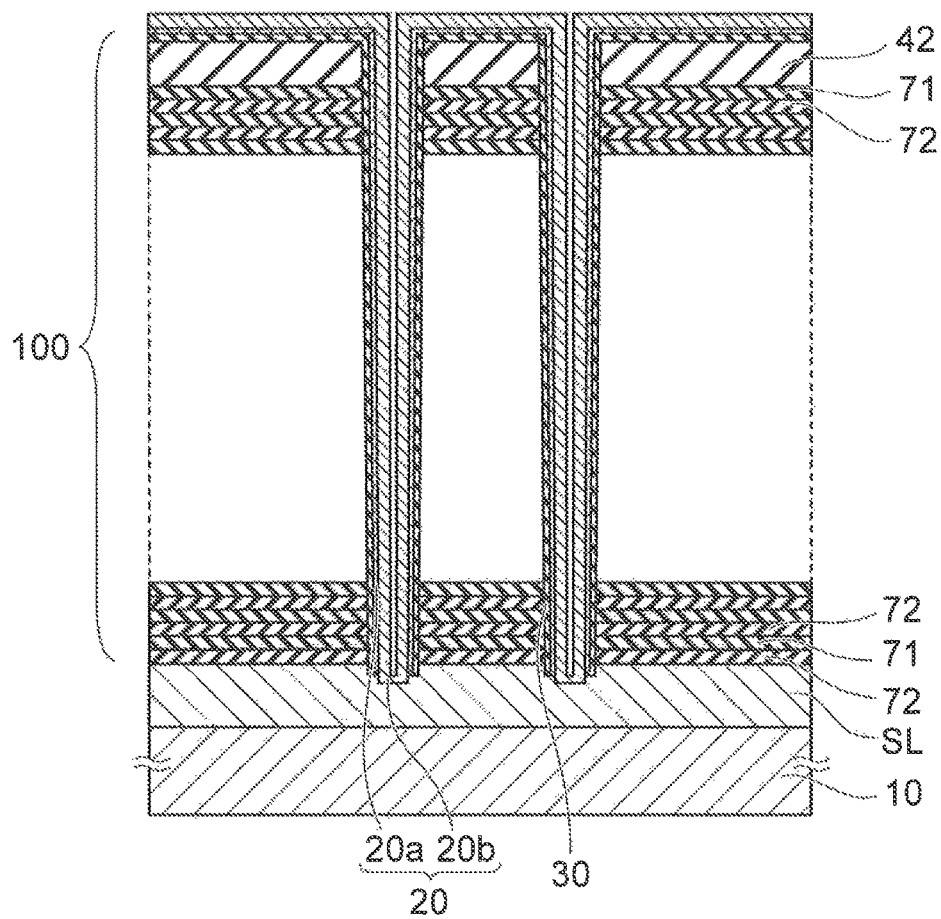

After the mask layer 45 is removed, a semiconductor film 20b is formed in the memory hole MH as shown in FIG. 9.

The semiconductor film 20b is formed on the side surface of the cover film 20a, and the bottom of the memory hole MH where the source layer SL is exposed.

The cover film 20a and the semiconductor film 20b are formed as e.g. an amorphous silicon film, and then crystallized into a polycrystalline silicon film by heat treatment. The cover film 20a, in combination with the semiconductor film 20b, constitutes a part of the aforementioned semiconductor film 20.

Figure 10:
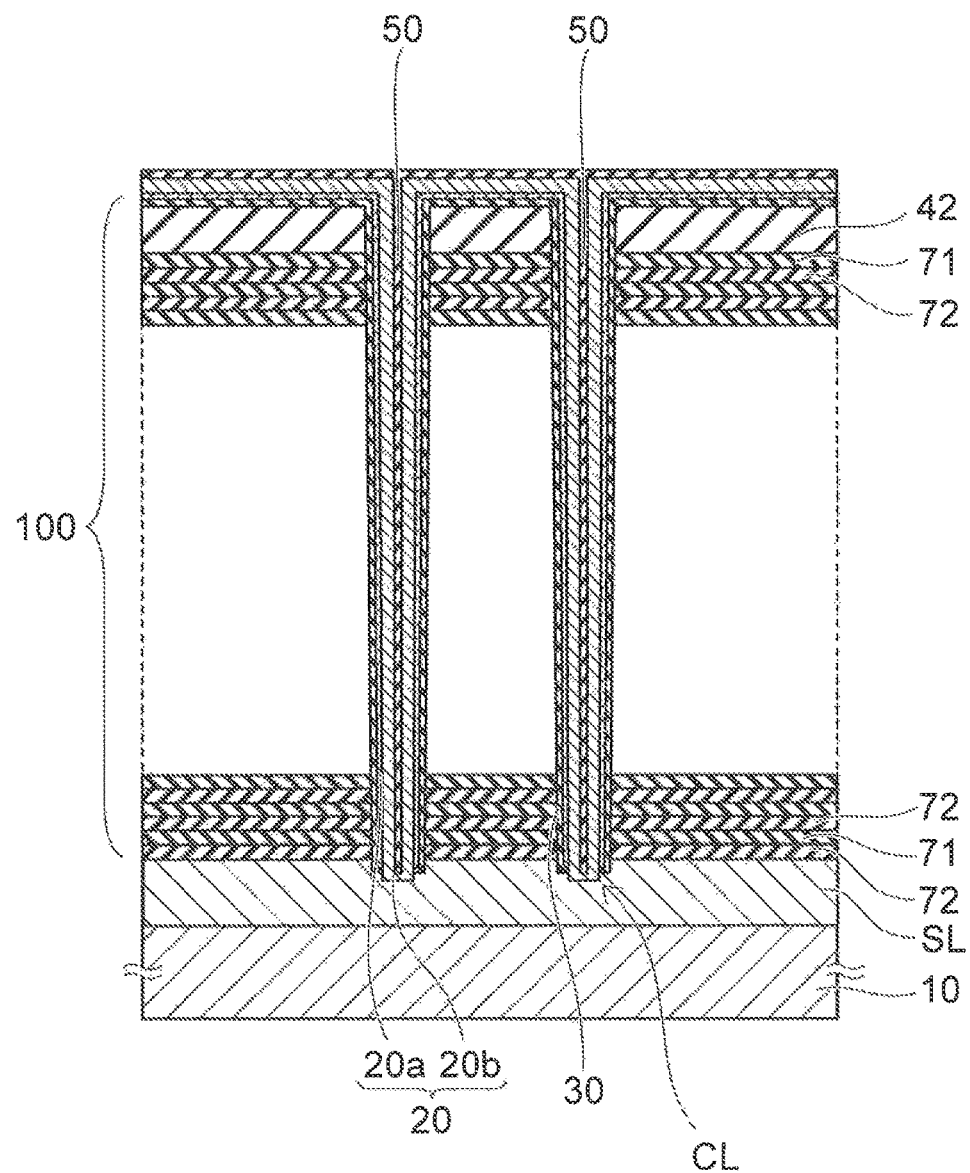

As shown in FIG. 10, a core film 50 is formed inside the semiconductor film 20b. The stacked film of the memory film 30, the semiconductor film 20, and the core film 50 constitutes a columnar part CL.

Figure 11:
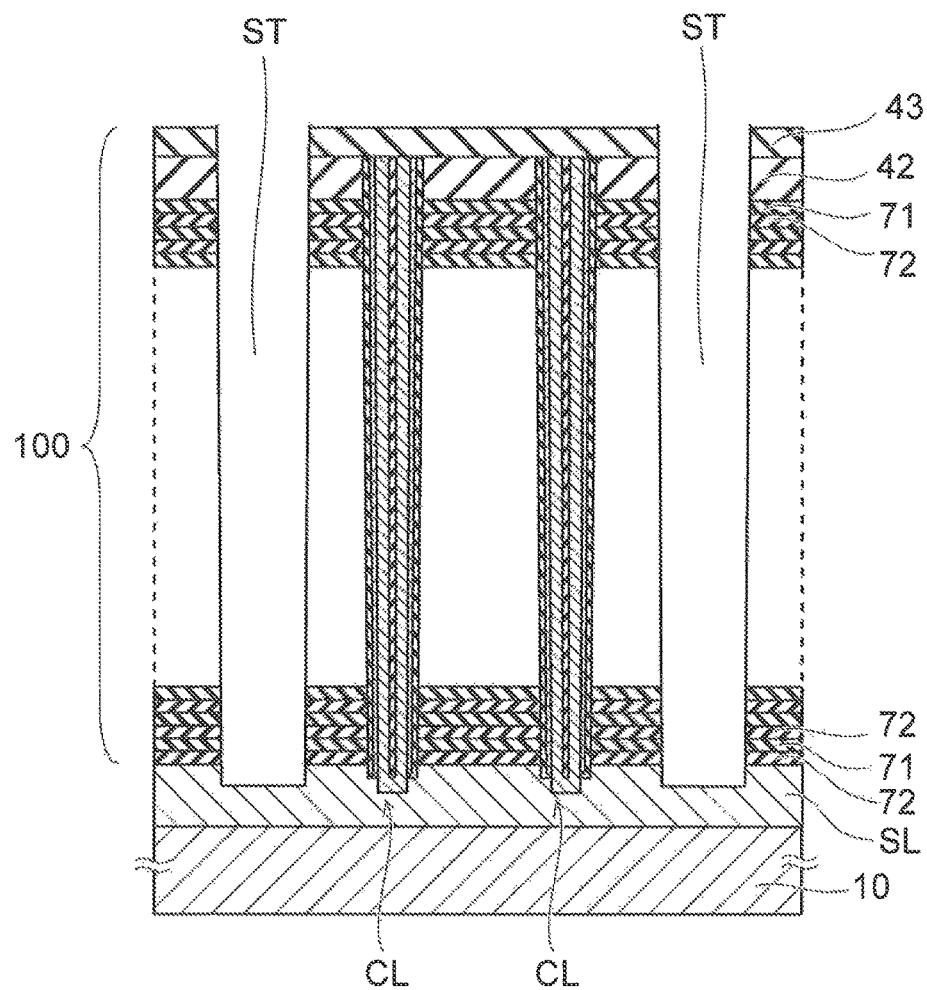

The films deposited on the insulating film 42 shown in FIG. 10 are removed by chemical mechanical polishing (CMP) or etch-back. Then, as shown in FIG. 11, an insulating film 43 is formed on the insulating film 42. The insulating film 43 covers the upper end of the stacked film constituting the columnar part CL.

Then, a plurality of slits ST are formed in the stacked body 100 including the insulating film 43, the insulating film 42, the plurality of first sacrificial films 71, and the plurality of second sacrificial films 72 by RIE technique using a mask, not shown.

As shown in FIG. 11, the slit ST penetrates through the stacked body 100 near the columnar part CL and extends to the source layer SL. As in forming the memory hole MH, the plurality of first sacrificial films (silicon nitride films) 71 and the plurality of second sacrificial films (silicon oxide films) 72 are continuously etched by RIE technique using e.g. a fluorine-containing gas.

Figure 12:
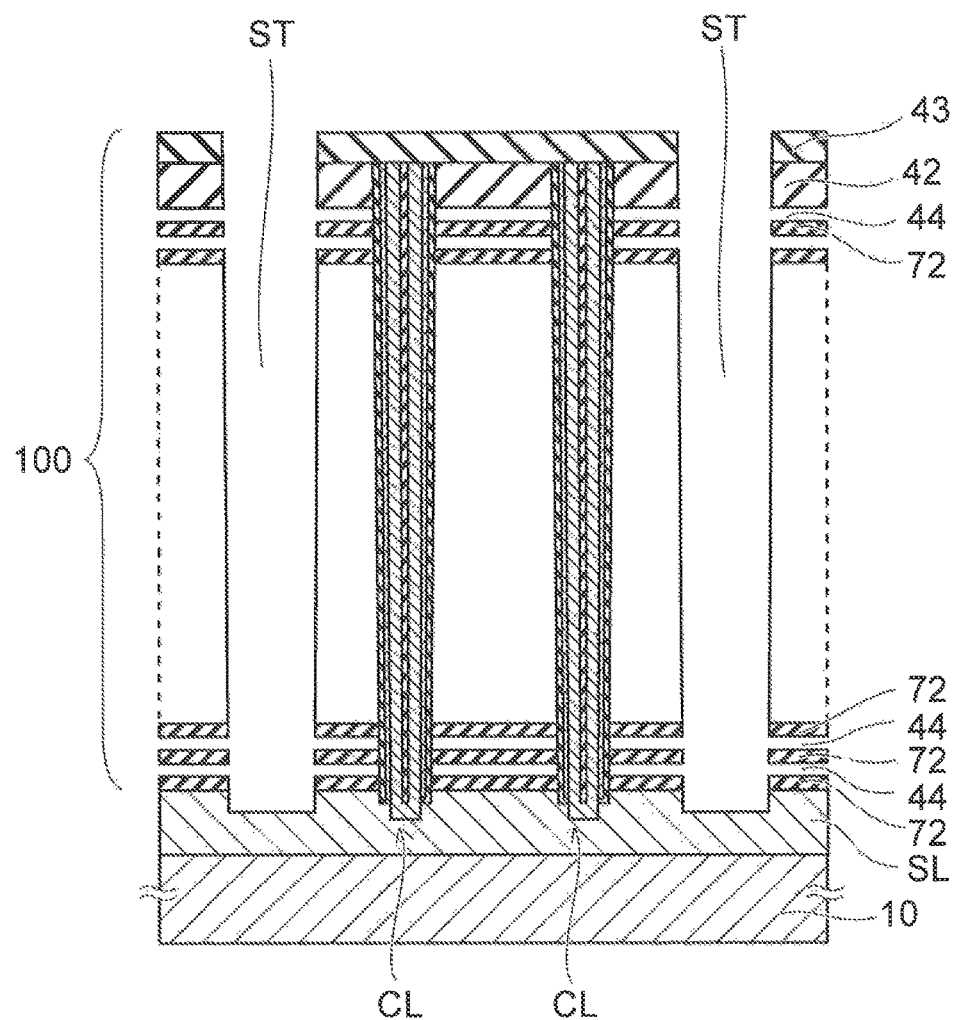

Next, the first sacrificial film 71 is removed by an etching solution supplied through the slit ST. By the removal of the first sacrificial film 71, as shown in FIG. 12, an air gap 44 is formed between the second sacrificial films 72 adjacent in the stacking direction.

For instance, the first sacrificial film 71 made of silicon nitride film is removed by an etching solution containing phosphoric acid. The first sacrificial film (silicon nitride film) 71 has a sufficiently high etching selection ratio to the second sacrificial film 72, the insulating films 42, 43, and the source layer SL. That is, the second sacrificial film 72, the insulating films 42, 43, and the source layer SL have high etching resistance to phosphoric acid, and are left without being etched.

The block film 35, shown in FIG. 3, provided at the outermost periphery of the columnar part CL is also resistant to phosphoric acid. This suppresses etching of the side surface of the columnar part CL by phosphoric acid infiltrated through the air gap 44.

Furthermore, the upper end of the columnar part CL is covered with the insulating film 43. Thus, etching from the upper end side of the columnar part CL can also be suppressed.

The plurality of second sacrificial films 72 stacked via the air gap 44 are supported by the columnar part CL. The lower end of the columnar part CL is supported by the source layer SL and the substrate 10. The upper end of the columnar part CL is supported by the insulating films 42, 43.

Figure 13:
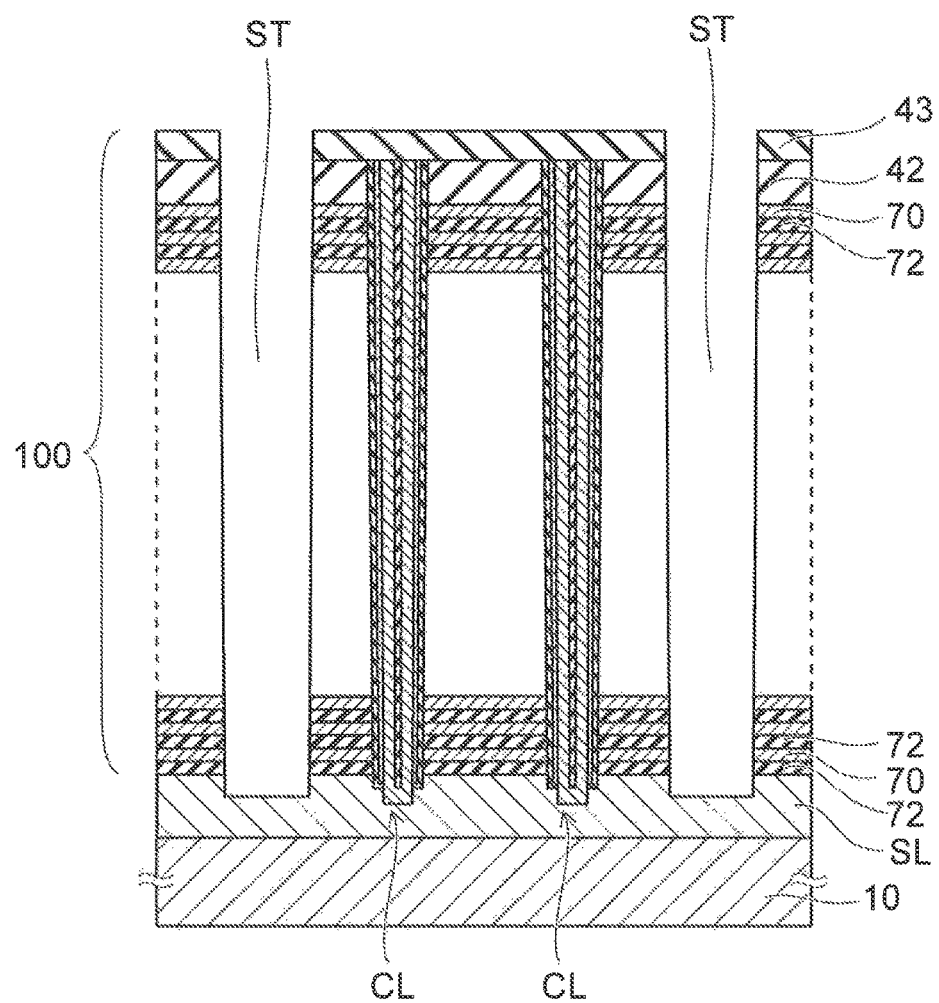

As shown in FIG. 13, an electrode film 70 is formed in the air gap 44 formed by the removal of the first sacrificial film 71. For instance, a tungsten film or molybdenum film is formed as the electrode film 70 by chemical vapor deposition (CVD) technique. A source gas is infiltrated into the air gap 44 through the slit ST. Thus, the electrode film 70 is deposited in the air gap 44.

As shown in FIG. 13, the electrode film 70 is formed between the second sacrificial films 72. The processing body is formed. The processing body includes the stacked body 100 including a plurality of electrode films 70 and a plurality of second sacrificial films 72 stacked alternately. The processing body further includes the columnar part CL penetrating through the stacked body 100 and the slit ST penetrating through the stacked body 100. At this time, each electrode film 70 may be formed as a stacked structure including a barrier metal film on the upper surface and the lower surface of the tungsten film or molybdenum film.

Figure 14:
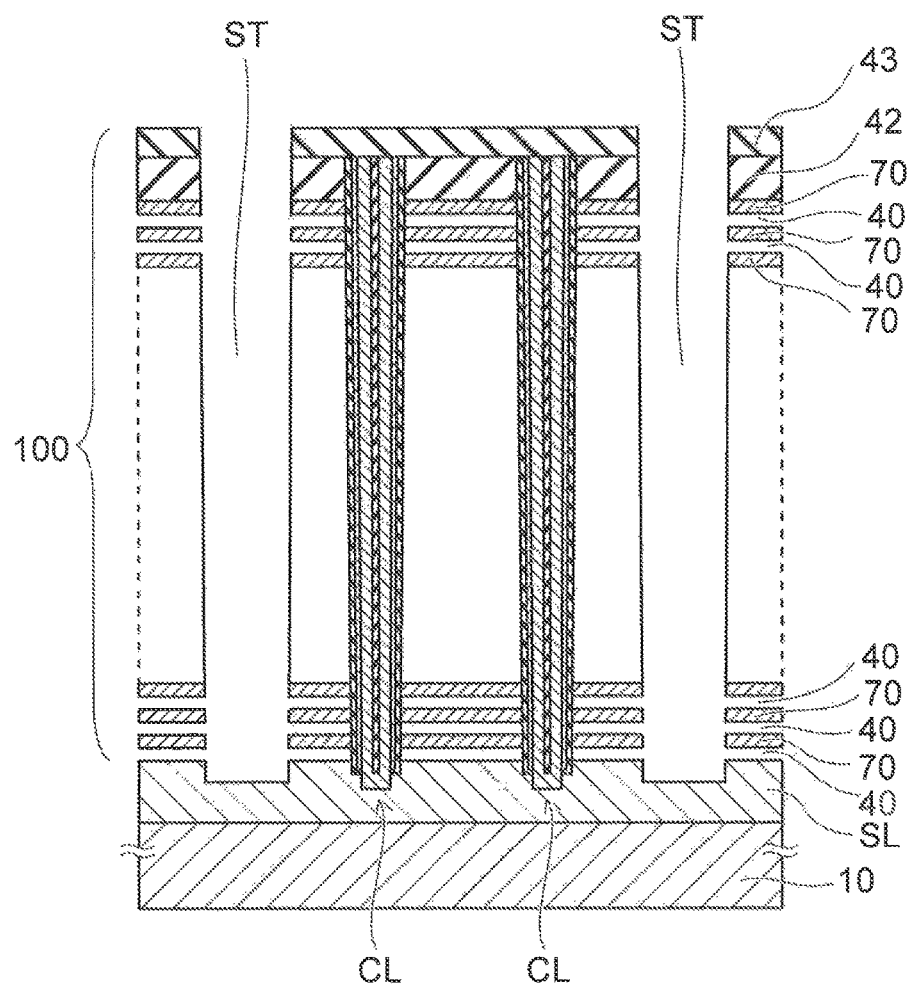

Next, the second sacrificial film 72 in the processing body shown in FIG. 13 is removed by an etching solution supplied through the slit ST. By the removal of the second sacrificial film 72, as shown in FIG. 14, an air gap 40 is formed between the electrode films 70 adjacent in the stacking direction.

For instance, the second sacrificial film 72 made of silicon oxide film is removed by an etching solution containing hydrofluoric acid.

The second sacrificial film 72 has a sufficiently high etching selection ratio to the electrode film 70, the insulating films 42, 43, and the source layer SL. That is, the electrode film 70, the insulating films 42, 43, and the source layer SL have high etching resistance to hydrofluoric acid, and are left without being etched.

The block film 35 provided at the outermost periphery of the columnar part CL is also resistant to hydrofluoric acid. This suppresses etching of the side surface of the columnar part CL by hydrofluoric acid infiltrated through the air gap 40.

Furthermore, the upper end of the columnar part CL is covered with the insulating film 43. Thus, etching from the upper end side of the columnar part CL can also be suppressed.

The plurality of electrode films 70 stacked via the air gap 40 are supported by the columnar part CL. The lower end of the columnar part CL is supported by the source layer SL and the substrate 10. The upper end of the columnar part CL is supported by the insulating films 42, 43.

After the air gap 40 is formed, as shown in FIG. 2, an insulating film 48 is formed on the insulating film 43 so as to cover the upper end of the slit ST. The upper end of the slit ST is occluded with the insulating film 48. For instance, a silicon oxide film is formed as the insulating film 48 by CVD technique. The opening of the slit ST is sufficiently narrow. Thus, the source gas of CVD is less likely to enter the slit ST. This prevents the insulating film 48 from extending to the position of the air gap 40 between the electrode films 70.

Alternatively, as shown in FIG. 17, the insulating film 49 extends slightly into the slit ST on the upper end side, and does not extend to the position of the air gap 40 between the electrode films 70.

The electrode film 70 is not limited to being formed by replacing the sacrificial film. The electrode film 70 may be stacked on the substrate 10 before forming the memory hole MH.

Figure 15:
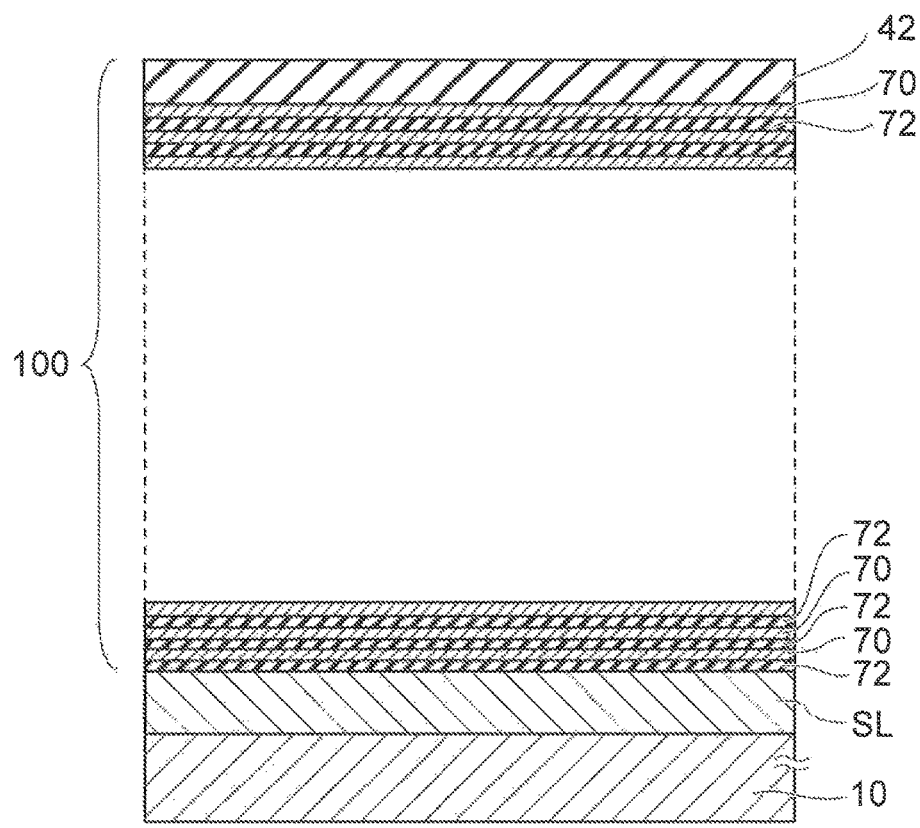

That is, as shown in FIG. 15, sacrificial films (silicon oxide films) 72 and electrode films 70 are alternately stacked on the source layer SL. An insulating film 42 is formed on the uppermost electrode film 70.

Figure 16:
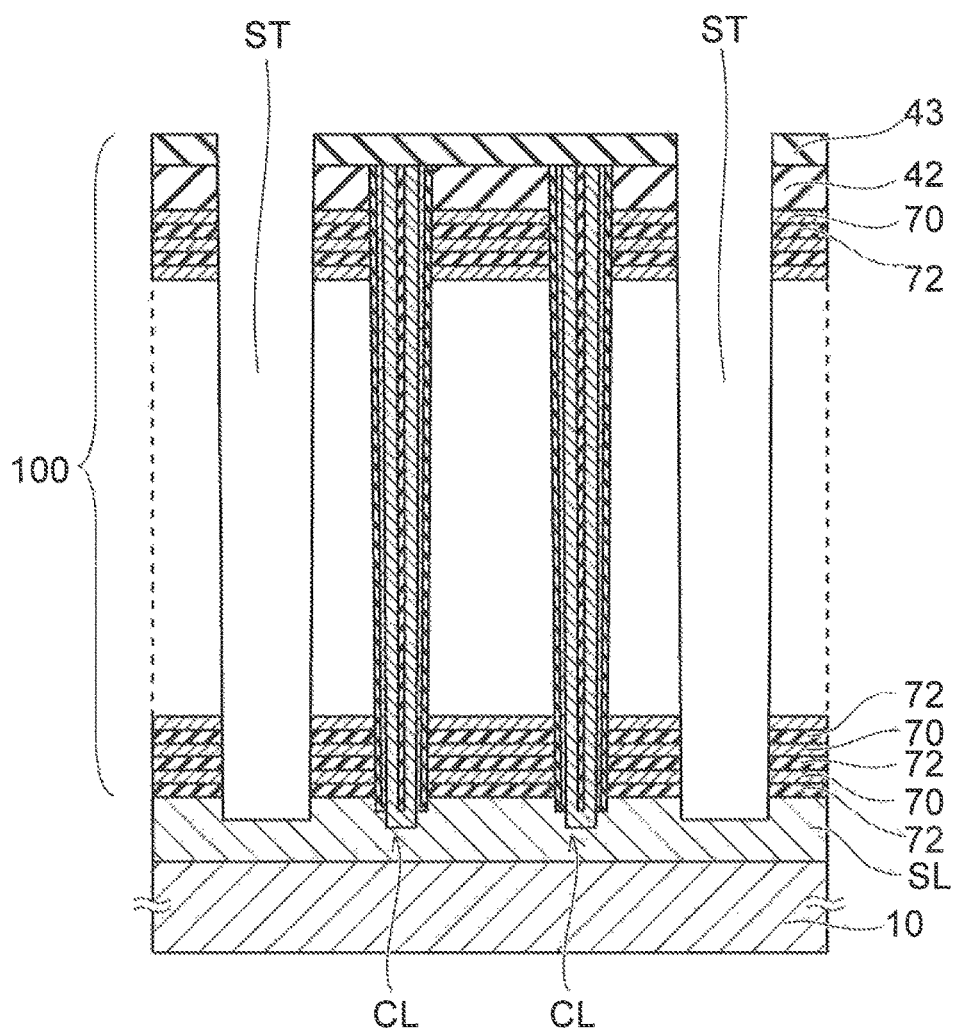

A memory hole MH and a columnar part CL are formed in this stacked body 100. Furthermore, as shown in FIG. 16, an insulating film 43 is formed on the insulating film 42 so as to cover the upper end of the columnar part CL. Furthermore, a slit ST extending to the source layer SL is formed in the stacked body 100.

Then, the second sacrificial film 72 is removed by an etching solution supplied through the slit ST. By the removal of the second sacrificial film 72, as shown in FIG. 14, an air gap 40 is formed between the electrode films 70 adjacent in the stacking direction.

Then, the upper end of the slit ST is occluded with the insulating film 48 or the insulating film 49 described above.

Next, a second embodiment is described. The same elements as those in the above first embodiment are labeled with like reference numerals, and the description thereof may be omitted.

Figure 18:
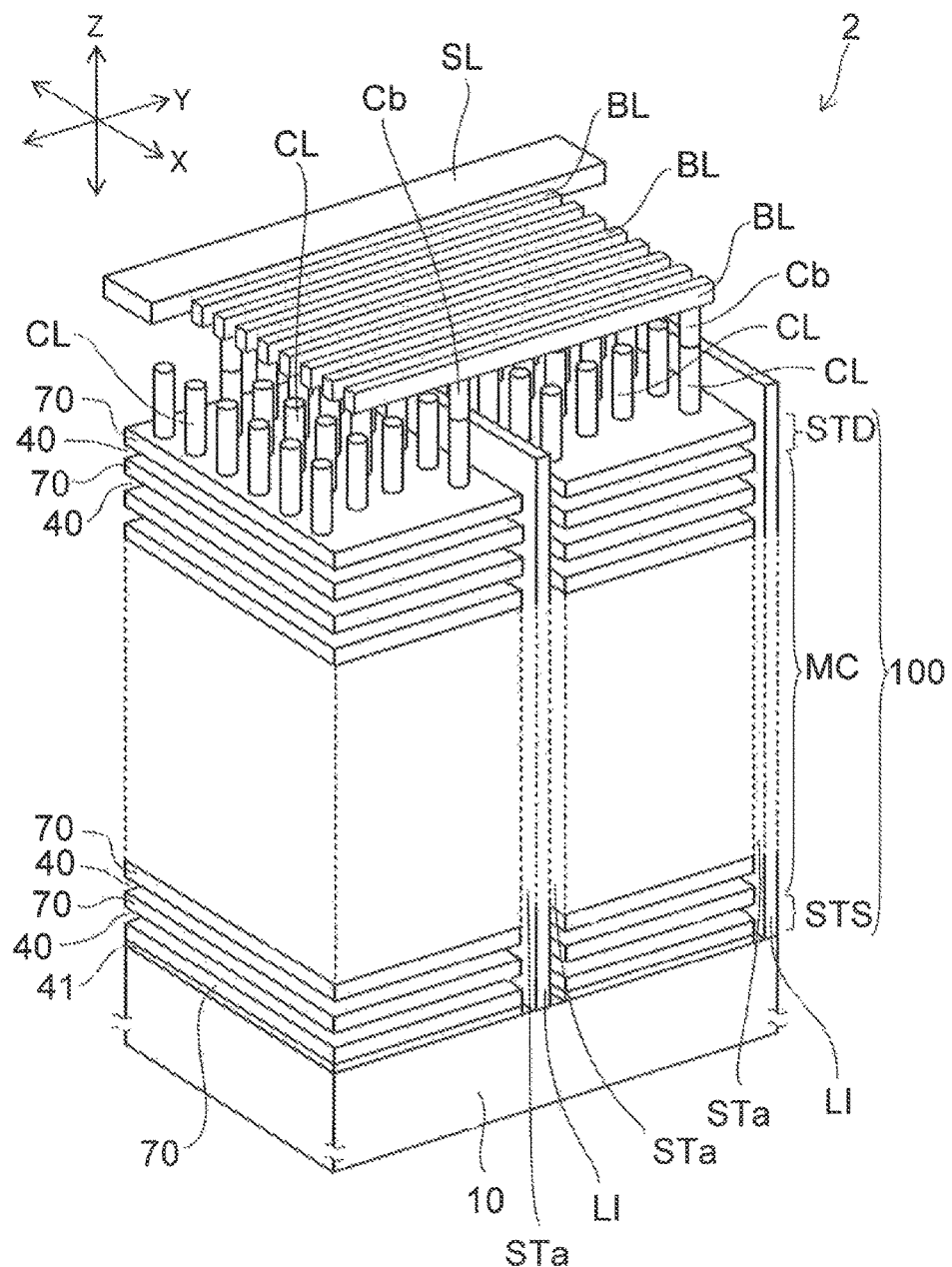
FIG. 18 is a schematic perspective view of a semiconductor device of a second embodiment.

FIG. 18 is a schematic perspective view of a memory cell array 2 of the second embodiment.

The memory cell array 2 includes a substrate 10, a stacked body 100 provided on the major surface of the substrate 10, a plurality of columnar parts CL, a plurality of interconnect parts LI, and an upper interconnect provided above the stacked body 100. FIG. 18 shows e.g. a bit line BL and a source layer SL as the upper interconnect.

The columnar part CL is formed like a circular column or elliptical column extending in the stacking direction (Z-direction) in the stacked body 100. The upper end of the columnar part CL is connected to the bit line BL through a contact part Cb.

The interconnect part LI spreads in the stacking direction (Z-direction) of the stacked body 100 and the X-direction between the upper interconnect and the substrate 10. The interconnect part LI separates the stacked body 100 in the Y-direction.

Figure 19:
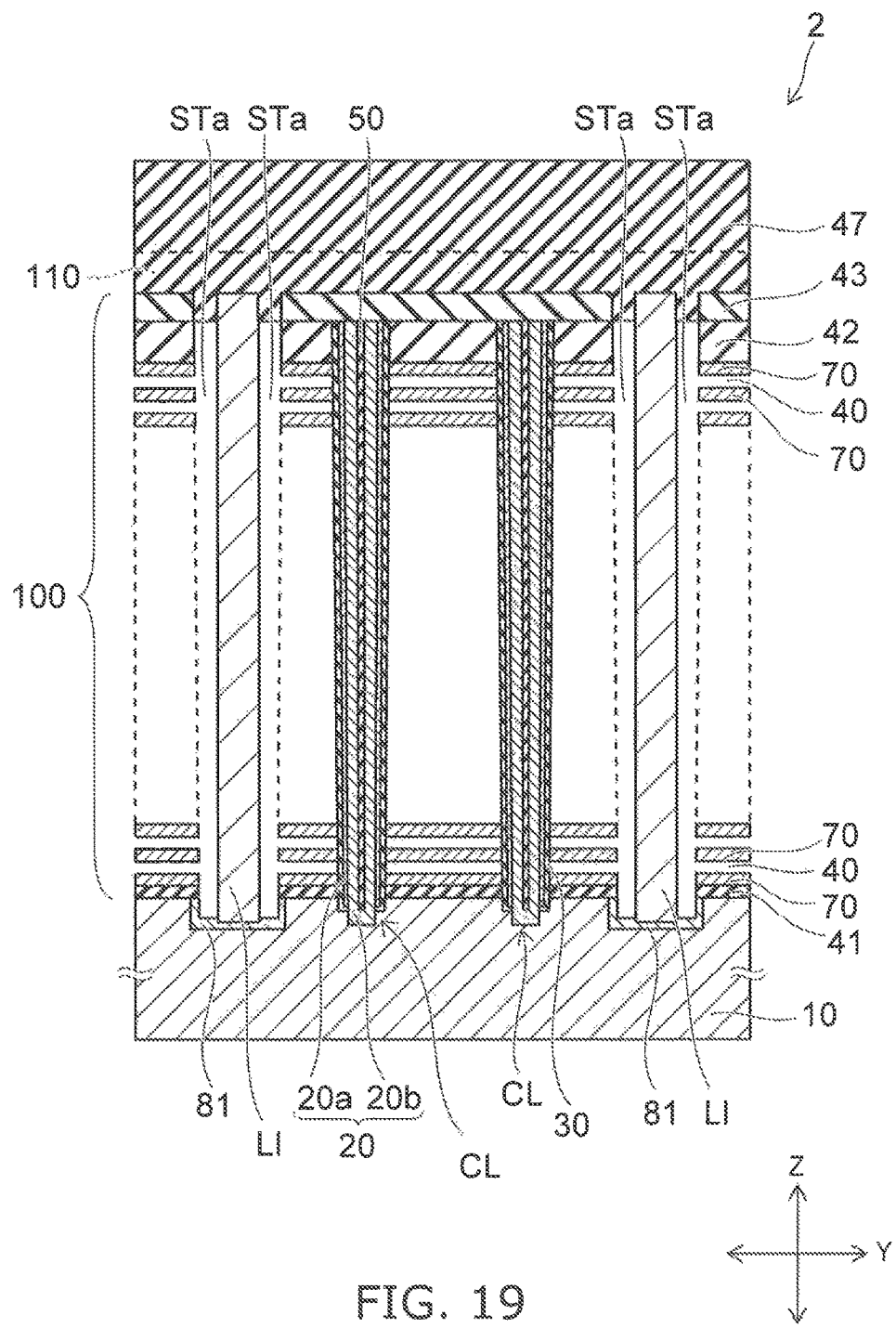
FIG. 19 is a schematic sectional view of the semiconductor device of the second embodiment.

FIG. 19 is a schematic sectional view of the memory cell array 2.

The stacked body 100 includes a plurality of electrode films 70 stacked on the major surface of the substrate 10. The electrode films 70 are stacked in the direction (Z-direction) perpendicular to the major surface of the substrate 10 at a prescribed pitch via an air gap 40.

An insulating film 41 is provided between the major surface of the substrate 10 and the lowermost electrode film 70. The insulating film 41 is in contact with the major surface (front surface) of the substrate 10 and the lowermost electrode film 70.

An insulating film 42 is provided on the uppermost electrode film 70. An insulating film 43 is provided on the insulating film 42. The uppermost electrode film 70 is in contact with the insulating film 42.

Figure 20:
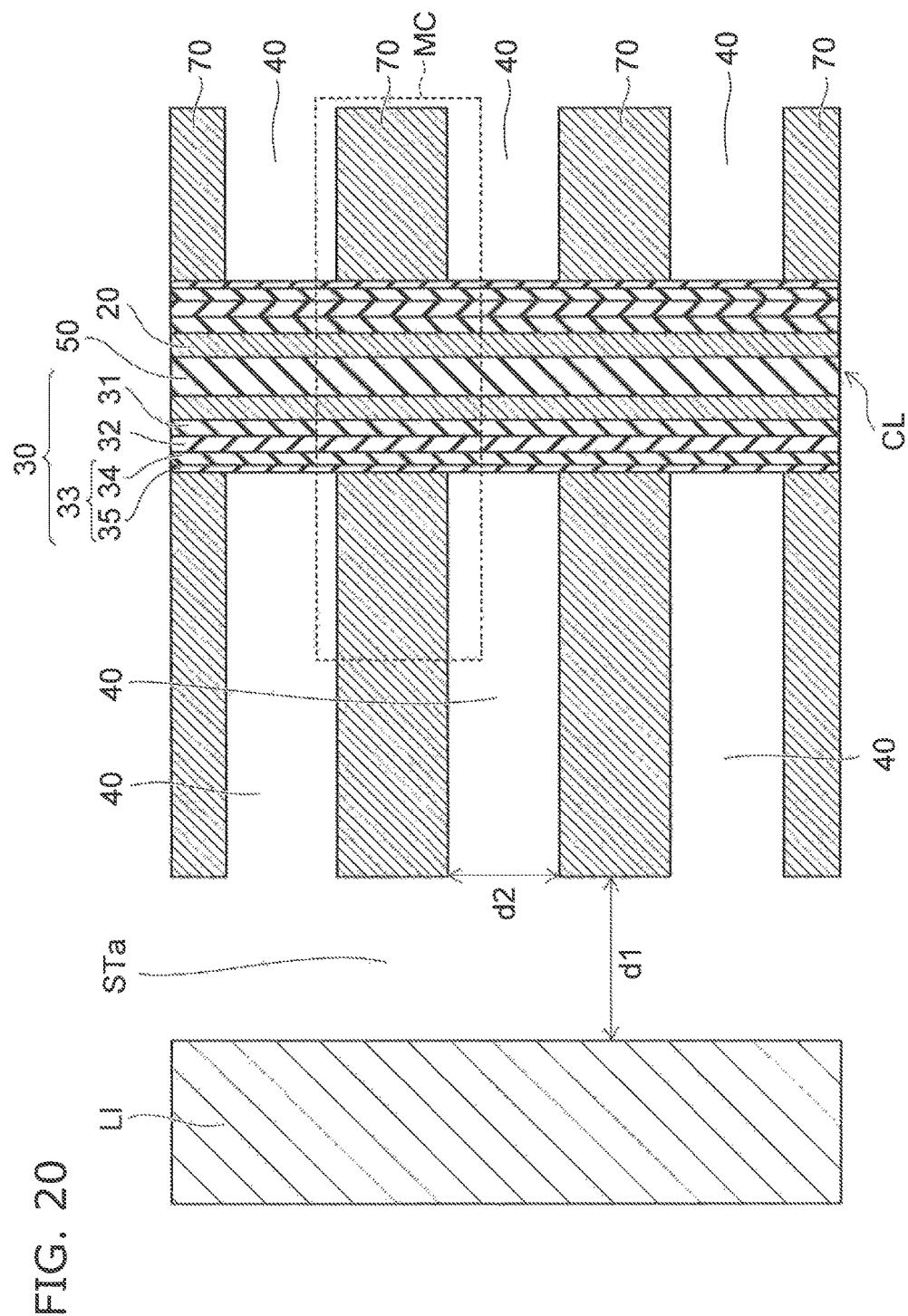
FIG. 20 is a partially enlarged sectional view of FIG. 19.

FIG. 20 is a partially enlarged sectional view of FIG. 19.

As in the first embodiment, the columnar part CL is a stacked film including a memory film 30, a semiconductor film 20, and a core film 50. The upper end of the semiconductor film 20 is connected to the bit line BL through the contact part Cb shown in FIG. 18.

The semiconductor film 20, the memory film 30, and the electrode film 70 constitute a memory cell MC. In FIG. 20, one memory cell MC is schematically shown by a dashed line. The memory cell MC has a vertical transistor structure in which the electrode film 70 surrounds the semiconductor film 20 via the memory film 30.

As shown in FIG. 18, a drain side select transistor STD is provided at the upper end part of the columnar part CL. A source side select transistor STS is provided at the lower end part of the columnar part CL. For instance, the lowermost electrode film 70 functions as a control gate of the source side select transistor STS. For instance, the uppermost electrode film 70 functions as a control gate of the drain side select transistor STD.

A plurality of memory cells MC are provided between the drain side select transistor STD and the source side select transistor STS. The memory cells MC, the drain side select transistor STD, and the source side select transistor STS are series connected through the semiconductor film 20 and constitute one memory string. Such memory strings are arranged in e.g. a staggered arrangement in the plane direction parallel to the X-Y plane. Thus, the plurality of memory cells MC are provided three-dimensionally in the X-direction, the Y-direction, and the Z-direction.

Both Y-direction side surfaces of the interconnect part LI separating the stacked body 100 in the Y-direction are adjacent to a slit (second air gap) STa as shown in FIGS. 18 and 19. The slit STa is provided between the side surface of the interconnect part LI and the stacked body 100. The slit STa extends in the stacking direction (Z-direction) to the substrate 10. Furthermore, the slit STa extends in the X-direction along the side surface of the interconnect part LI.

The interconnect part LI is a metal film primarily containing e.g. tungsten. The upper end of the interconnect part LI is connected to the source layer SL, shown in FIG. 18, provided above the stacked body 100. The lower end of the interconnect part LI is in contact with the substrate 10 as shown in FIG. 19. The lower end of the semiconductor film 20 is in contact with the substrate 10. The substrate 10 is e.g. a silicon substrate doped with impurity and having conductivity. Thus, the lower end of the semiconductor film 20 is electrically connectable to the source layer SL through the substrate 10 and the interconnect part LI.

As shown in FIG. 19, a semiconductor region 81 is formed in the surface of the substrate 10 in contact with the lower end of the interconnect part LI. A plurality of semiconductor regions 81 are provided corresponding to the plurality of interconnect parts LI. The plurality of semiconductor regions 81 include a p-type semiconductor region 81 and an n-type semiconductor region 81. The p-type semiconductor region 81 supplies holes to the semiconductor film 20 through the substrate 10 at the time of erase operation. At the time of read operation, electrons are supplied from the interconnect part LI through the n-type semiconductor region 81 and the substrate 10 to the semiconductor film 20.

Potential control is performed on the lowermost electrode film 70 provided on the surface (major surface) of the substrate 10 via the insulating film 41. This induces a channel in the surface of the substrate 10 between the semiconductor region 81 and the lower end of the semiconductor film 20. Thus, a current can be passed between the semiconductor region 81 and the lower end of the semiconductor film 20.

The lowermost electrode film 70 functions as a control gate for inducing a channel in the surface of the substrate 10. The insulating film 41 functions as a gate insulating film. The portion between the surface of the substrate 10 and the lowermost electrode film 70 is not an air gap, but the insulating film 41 having higher dielectric constant than air. This enables fast driving by capacitive coupling between the lowermost electrode film 70 and the surface of the substrate 10.

On the other hand, the air gap 40 is formed between the control gates (electrode films 70) of the memory cells MC adjacent in the stacking direction (Z-direction). This can reduce the interconnect capacitance between the vertically adjacent electrode films 70 and enables fast operation of the memory cell MC. Furthermore, this can suppress interference between adjacent cells such as threshold variation due to capacitive coupling between the vertically adjacent electrode films 70.

An air gap is formed also between the side surface of the interconnect part LI and the stacked body 100. The slit STa is formed between the side surface of the interconnect part LI and the stacked body 100. The slit STa communicates with the air gap 40 between the electrode films 70.

An insulating film 47 is provided on the insulating film 43. A part of the insulating film 47 occludes the upper end of the slit STa. For instance, a silicon oxide film having low coverage is formed as the insulating film 47 by CVD technique. This can prevent the slit STa from being filled with the insulating film 47.

The upper end of the slit STa is occluded in the state in which an air gap communicating with the air gap 40 between the electrode films 70 is left below the uppermost electrode film 70. The opening on the slit STa side of the air gap 40 between the electrode films 70 is not covered with the insulating film 47.

The slit STa extends also into the insulating film above the upper surface of the uppermost electrode film 70. In the example shown in FIG. 19, the boundary between the upper end of the slit STa and the insulating film 47 is depicted near the boundary between the insulating film 42 and the insulating film 43. However, the slit STa may extend into the insulating film 47 above the insulating film 43.

The Y-direction width of the slit STa is equivalent to the spacing d1 (shown in FIG. 20) between the side surface of the interconnect part LI and the electrode film 70 opposed to the side surface of the interconnect part LI across the slit STa. The Y-direction width of the slit STa is larger than the spacing d2 between the electrode films 70 adjacent in the stacking direction (Z-direction) via the air gap 40.

Also in the second embodiment, as in the first embodiment, no insulating film is formed in the end part on the slit STa side of the air gap 40. The air gap 40 between the electrode films 70 is integrally connected to the slit STa. This can ensure high breakdown voltage between the electrode films 70 even if the spacing d2 between the electrode films 70 adjacent in the stacking direction is narrowed.

Furthermore, the upper end of the slit STa extends into the insulating film above the upper surface of the uppermost electrode film 70. Thus, the creepage distance along the surface of the insulating film between the uppermost electrode film 70 and the side surface of the interconnect part LI opposed across the slit STa is larger than the Y-direction width of the slit STa. This can reduce the possibility of short circuit through the surface of the insulating film on the slit STa between the uppermost electrode film 70 and the side surface of the interconnect part LI opposed across the slit STa.

Furthermore, the Y-direction width of the slit STa is larger than the spacing between the electrode films 70 adjacent in the stacking direction via the air gap 40. The surface (lower surface) of part of the insulating film 47 occluding the upper end of the slit STa may be located near the upper surface of the uppermost electrode film 70. Even in this case, the creepage distance between the uppermost electrode film 70 and the side surface of the interconnect part LI along the surface of the insulating film 47 can be made larger than the spacing between the vertically adjacent electrode films 70. This can prevent short circuit through the surface of the insulating film 47 between the uppermost electrode film 70 and the side surface of the interconnect part LI.

Next, a method for manufacturing the memory cell array 2 of the second embodiment is described with reference to FIGS. 21 to 30B.

Figure 21:
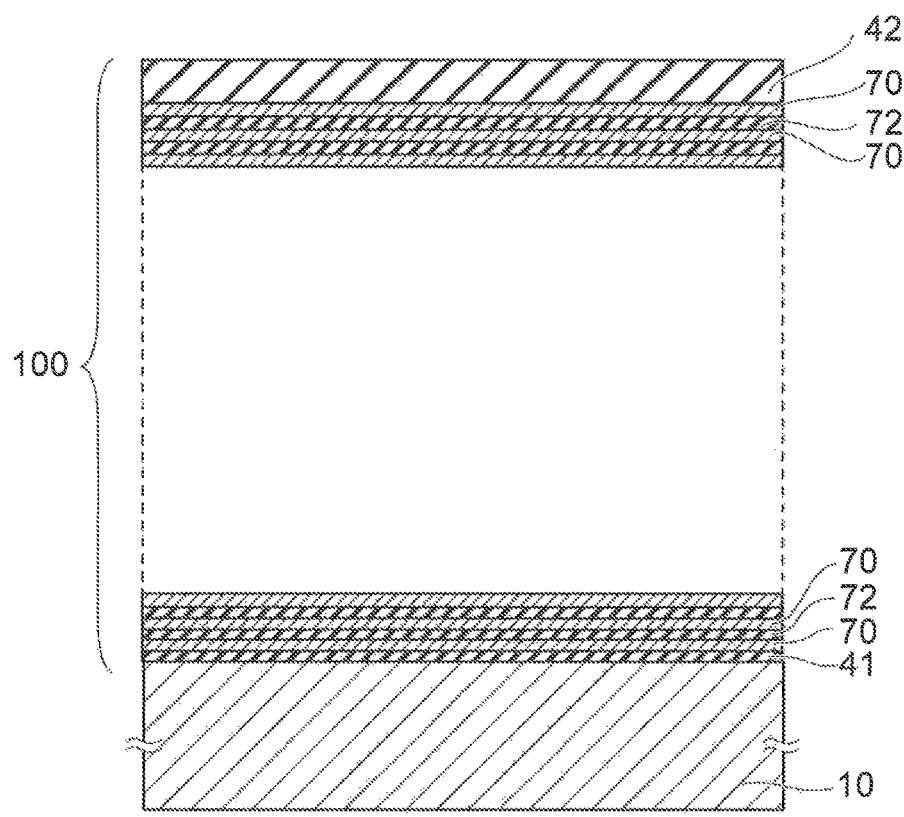
FIGS. 21 to 24 are schematic sectional views showing a method for manufacturing the semiconductor device of the second embodiment.

One of electrode films 70 and one of sacrificial films 72 are stacked alternately on a substrate 10 to form a stacked body 100. As shown in FIG. 21, an insulating film 41 is formed on the major surface of the substrate 10. A lowermost electrode film 70 is formed on the insulating film 41. The sacrificial film 72 and the electrode film 70 are alternately stacked on the lowermost electrode film 70. An insulating film 42 is formed on the uppermost electrode film 70. The electrode film 70 is e.g. a tungsten film or molybdenum film. The sacrificial film 72 is e.g. a silicon oxide film.

Figure 22:
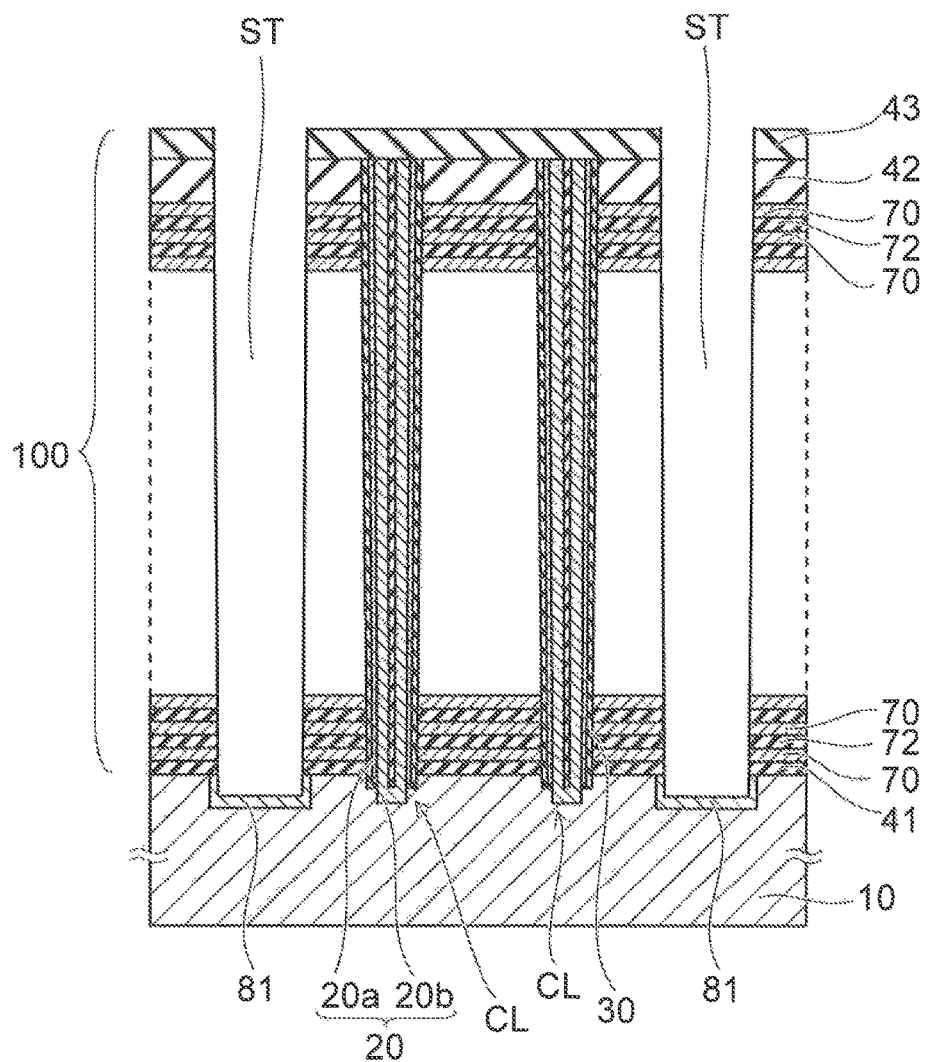

As in the first embodiment, the columnar part CL shown in FIG. 22 is formed in the stacked body 100. Then, an insulating film 43 is formed on the insulating film 42. The insulating film 43 covers the upper end of the columnar part CL.

A slit ST is formed in the stacked body 100. The slit ST penetrates through the stacked body 100 near the columnar part CL and extends to the substrate 10. An n-type semiconductor region 81 or a p-type semiconductor region 81 is formed in the surface of the substrate 10 at the bottom of the slit ST. In the stacked body 100 shown in FIG. 22, the electrode film 70 may be formed by replacing the sacrificial film through the slit ST as in the first embodiment.

Figure 23:
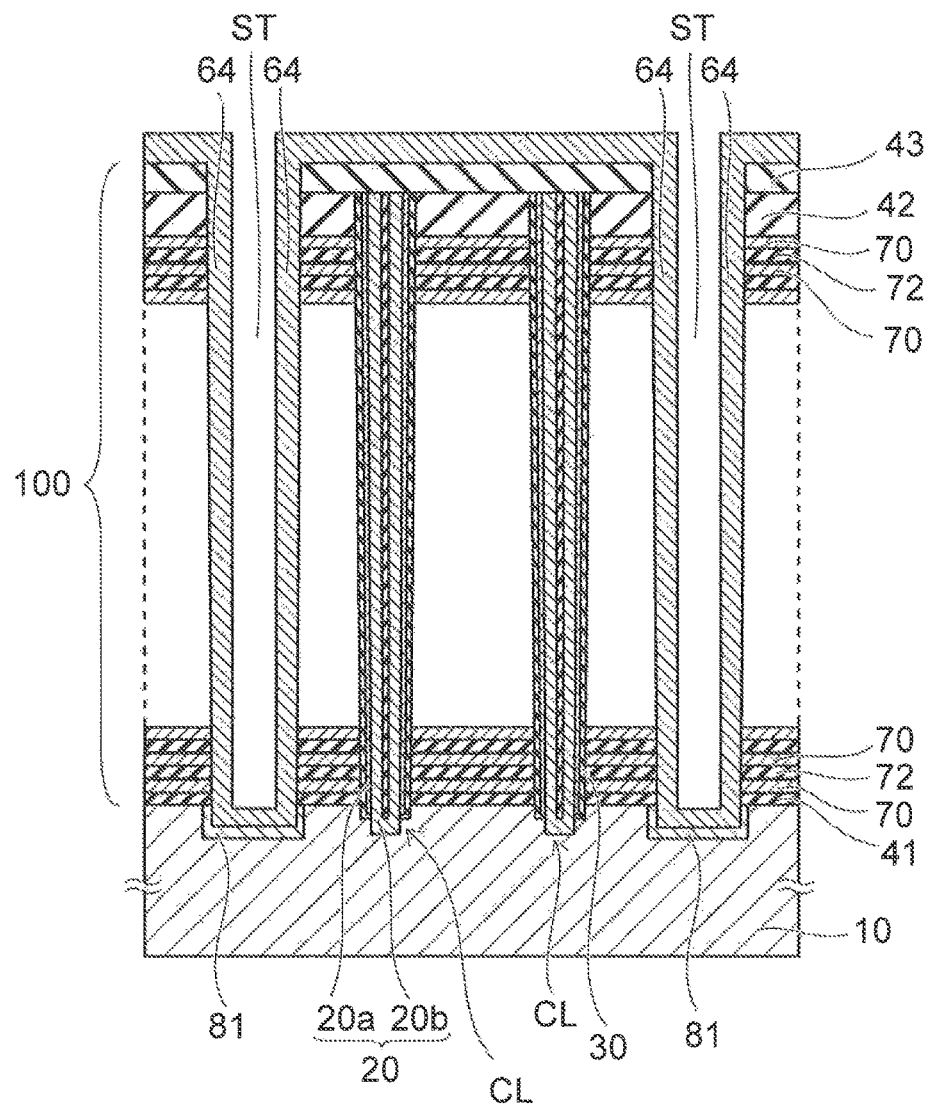
Figure 24:
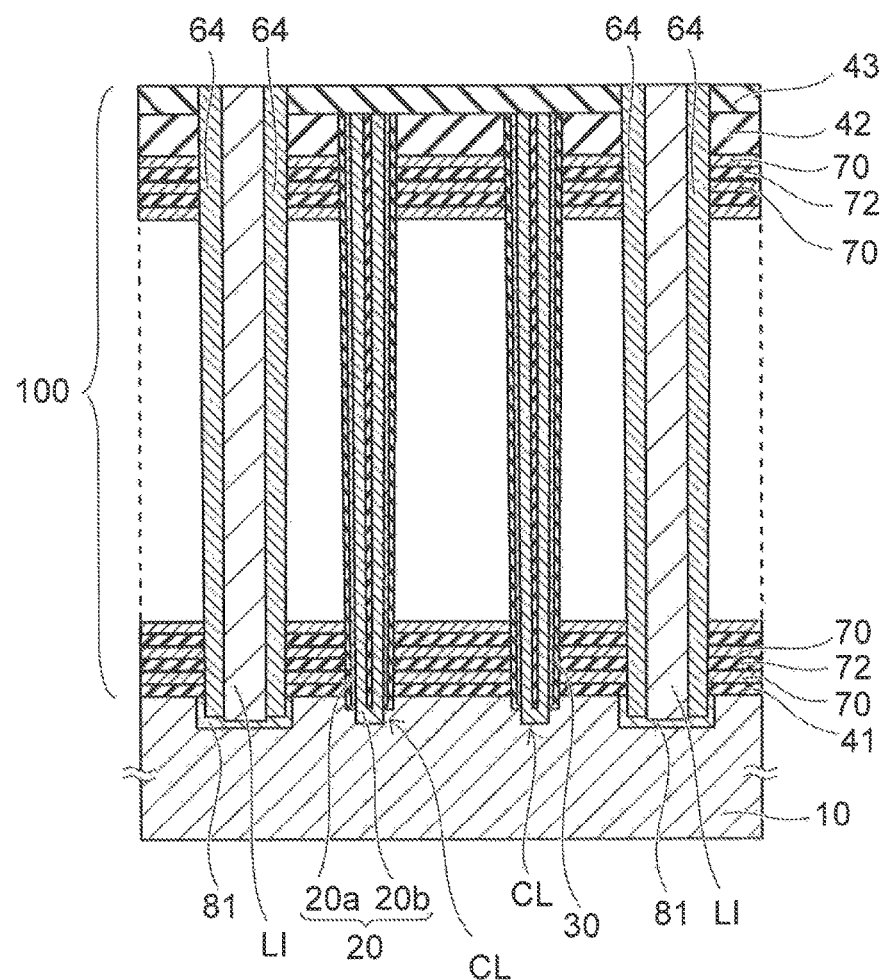

As shown in FIG. 23, a sacrificial film 64 is formed conformally on the bottom and side surface of the slit ST. The sacrificial film 64 at the bottom of the slit ST is removed by e.g. RIE technique. As shown in FIG. 24, an interconnect part LI is buried in the slit ST inside the sacrificial film 64. The sacrificial film 64 is formed on the side surface of the interconnect part LI in the slit ST.

The interconnect part LI contains e.g. tungsten. The sacrificial film 64 is e.g. a boron-silicate glass (BSG) film or silicon nitride film. Alternatively, the sacrificial film 64 is a stacked film of a silicon oxide film formed on the side surface of the interconnect part LI and a silicon nitride film formed on the side surface of the silicon oxide film.

As shown in FIG. 25B, a cover film 110 is formed on the upper surface of the stacked body 100. FIG. 25A is a top view of FIG. 25B. The cover film 110 covers the upper end of the interconnect part LI and the upper end of the sacrificial film 64. The upper end of the interconnect part LI and the upper end of the sacrificial film 64 are in contact with the cover film 110.

Figure 26A:
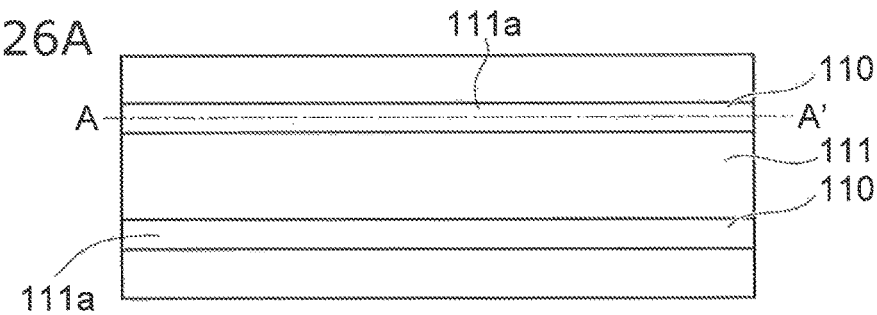
FIG. 26A is a schematic top view showing the method for manufacturing the semiconductor device of the second embodiment.

As shown in FIG. 26A, a resist film 111 is formed on the cover film 110. A slit 111a is selectively formed in the resist film 111. A part of the cover film 110 is exposed at the bottom of the slit 111a.

Figure 26B:
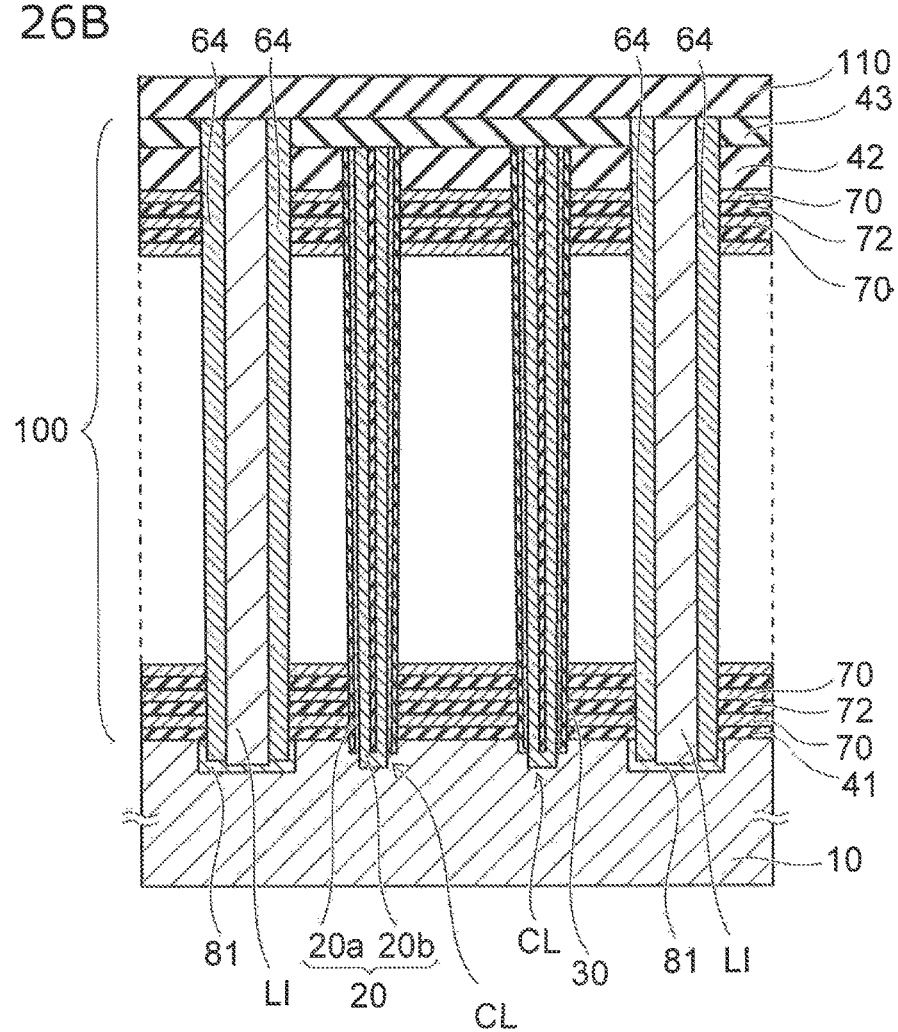
FIG. 26B is a cross sectional view taken along A-A' in FIG. 26A.

FIG. 26B is a cross sectional view taken along A-A' in FIG. 26A.

The slit 111a extends in a direction (Y-direction in FIG. 18) crossing the extending direction of the interconnect part LI (X-direction in FIG. 18).

The cover film 110 is etched using the resist film 111 as a mask. Then, the resist film 111 is removed. The slit 111a of the resist film 111 is transferred to the cover film 110. Thus, as shown in FIG. 27A, a slit 110a is formed in the cover film 110.

Figure 27A:
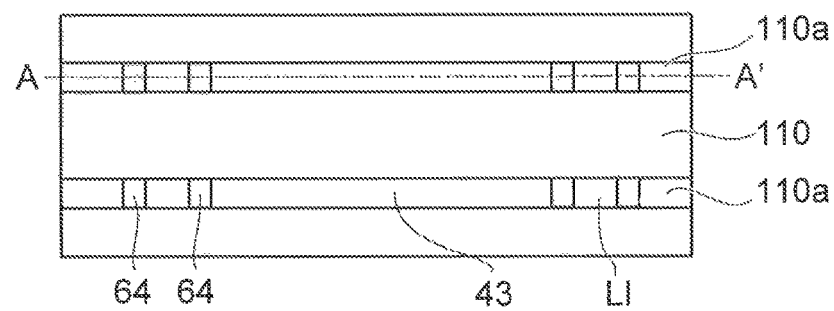
FIG. 27A is a schematic top view showing the method for manufacturing the semiconductor device of the second embodiment.
Figure 27B:
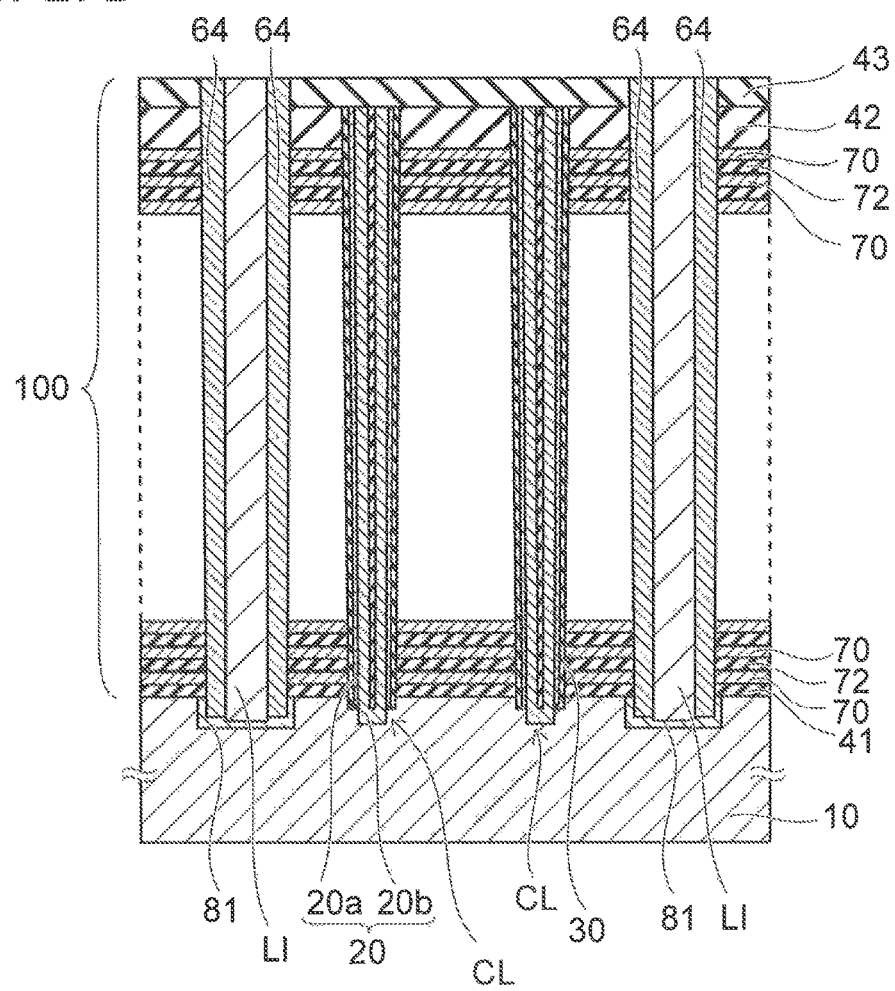
FIG. 27B is a cross sectional view taken along A-A' in FIG. 27A.

FIG. 27B is a cross sectional view taken along A-A' in FIG. 27A.

The slit 110a extends in a direction (Y-direction in FIG. 18) crossing the extending direction of the interconnect part LI (X-direction in FIG. 18). A plurality of slits 110a are arranged with spacing from each other in the extending direction of the interconnect part LI. A part of the interconnect part LI and a part of the sacrificial film 64 are exposed at the bottom of the slit 110a.

Then, the sacrificial film 64 is removed by etching. Etching by an etching solution proceeds from the upper end of the sacrificial film 64 exposed to the slit 110a.

In the case where the sacrificial film 64 is a silicon nitride film, the silicon nitride film can be removed with an etching solution containing phosphoric acid. In the case where the sacrificial film 64 is a silicon oxide film or BSG film, the film can be removed with an etching solution containing hydrofluoric acid.

The sacrificial film 64 has a sufficiently high etching selection ratio to the interconnect part LI, the electrode film 70, the insulating films 41, 42, 43, the cover film 110, and the substrate 10. That is, the interconnect part LI, the electrode film 70, the insulating films 41, 42, 43, the cover film 110, and the substrate 10 have high etching resistance to phosphoric acid and hydrofluoric acid, and are left without being etched.

The sacrificial film 64 is removed. Thus, as shown in FIG. 28B, a slit STa is formed between the side surface of the interconnect part LI and the stacked body 100.

Figure 28A:
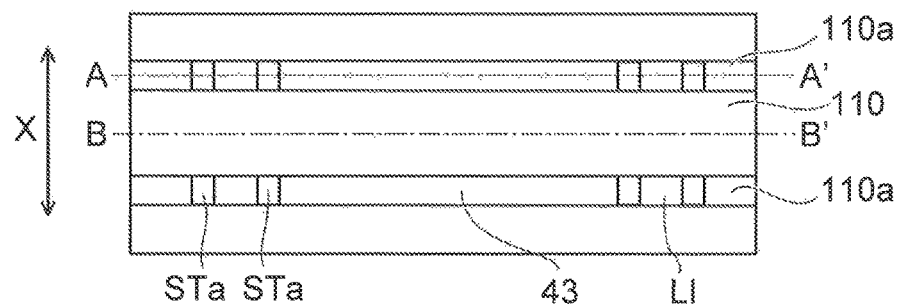
FIG. 28A is a schematic top view showing the method for manufacturing the semiconductor device of the second embodiment.
Figure 28B:
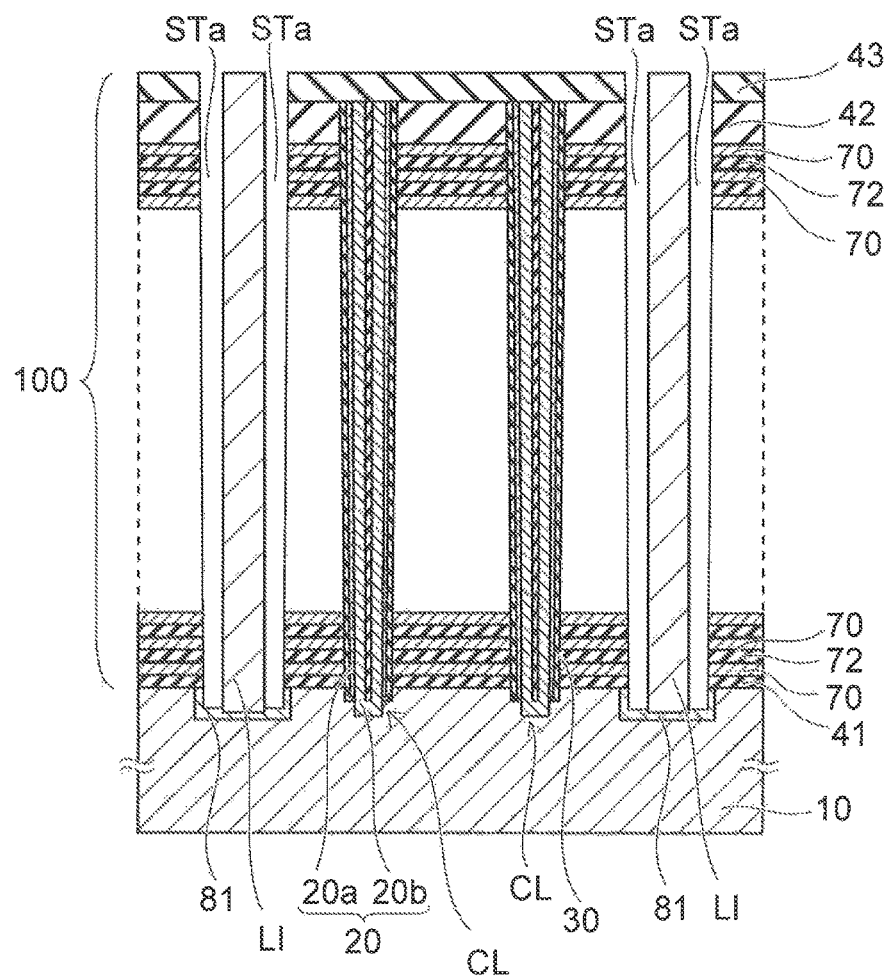
FIG. 28B is a cross sectional view taken along A-A' in FIG. 28A.

FIG. 28B is a cross sectional view taken along A-A' in FIG. 28A. FIG. 28B shows a cross section of the stacked body 100 below the slit 110a without the cover film 110.

Figure 29:
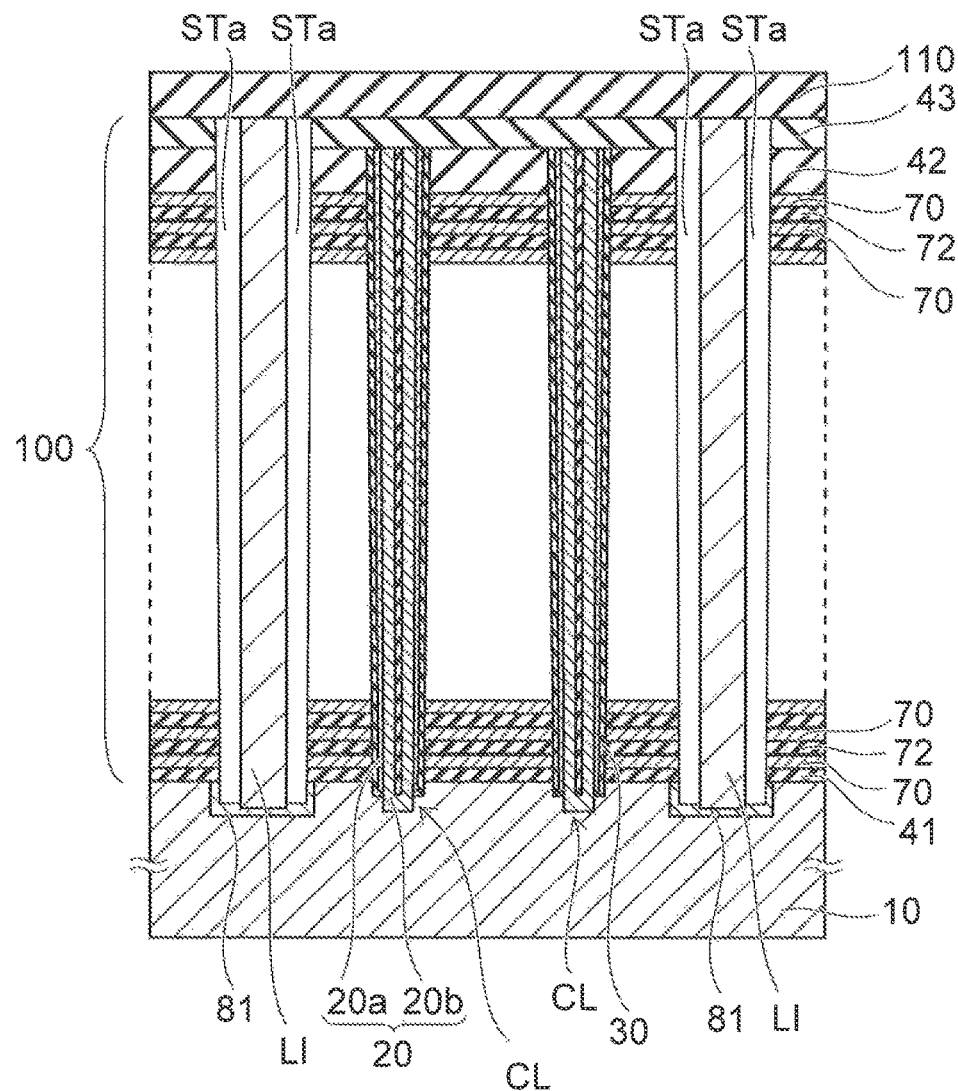
FIG. 29 is a cross sectional view taken along B-B' in FIG. 28A.

FIG. 29 is a cross sectional view taken along B-B' in FIG. 28A. FIG. 29 shows a cross section of the stacked body 100 in the region covered with the cover film 110.

Etching proceeds in the depth direction from the upper end side of the sacrificial film 64 exposed to the slit 110a of the cover film 110. Furthermore, corrosion of the sacrificial film 64 by the etching solution proceeds also in the extending direction of the interconnect part LI (X-direction).

As shown in FIGS. 28A and 29, a part of the upper surface of the interconnect part LI is in contact with the cover film 110 remaining selectively. The interconnect part LI loses the support from the stacked body 100 by the formation of the slit STa. However, the upper end and the lower end of the interconnect part LI are supported by the cover film 110 and the substrate 10, respectively. Thus, the interconnect part LI does not collapse.

The sacrificial film 72 between the electrode films 70 may be made of the same material as the sacrificial film 64 on the side surface of the interconnect part LI. In this case, when the sacrificial film 64 is etched, the sacrificial film 72 can be removed continuously. In this case, the upper side surface of the columnar part CL may be etched by prolonged exposure to the etching solution. However, the sacrificial film 72 between the electrode films 70 can be left at least around the columnar part CL by adjusting the time for etching the sacrificial film 64.

After the slit STa is formed, the sacrificial film 72 between the electrode films 70 can be removed by an etching solution supplied through the slit STa. By the removal of the sacrificial film 72, as shown in FIG. 30B, an air gap 40 communicating with the slit STa is formed between the vertically adjacent electrode films 70.

Figure 30A:
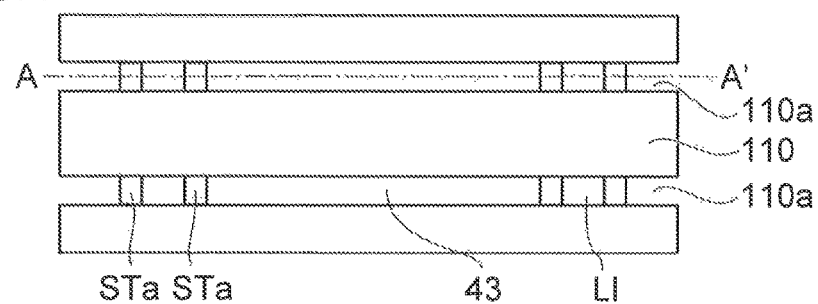
FIG. 30A is a schematic top view showing the method for manufacturing the semiconductor device of the second embodiment.
Figure 30B:
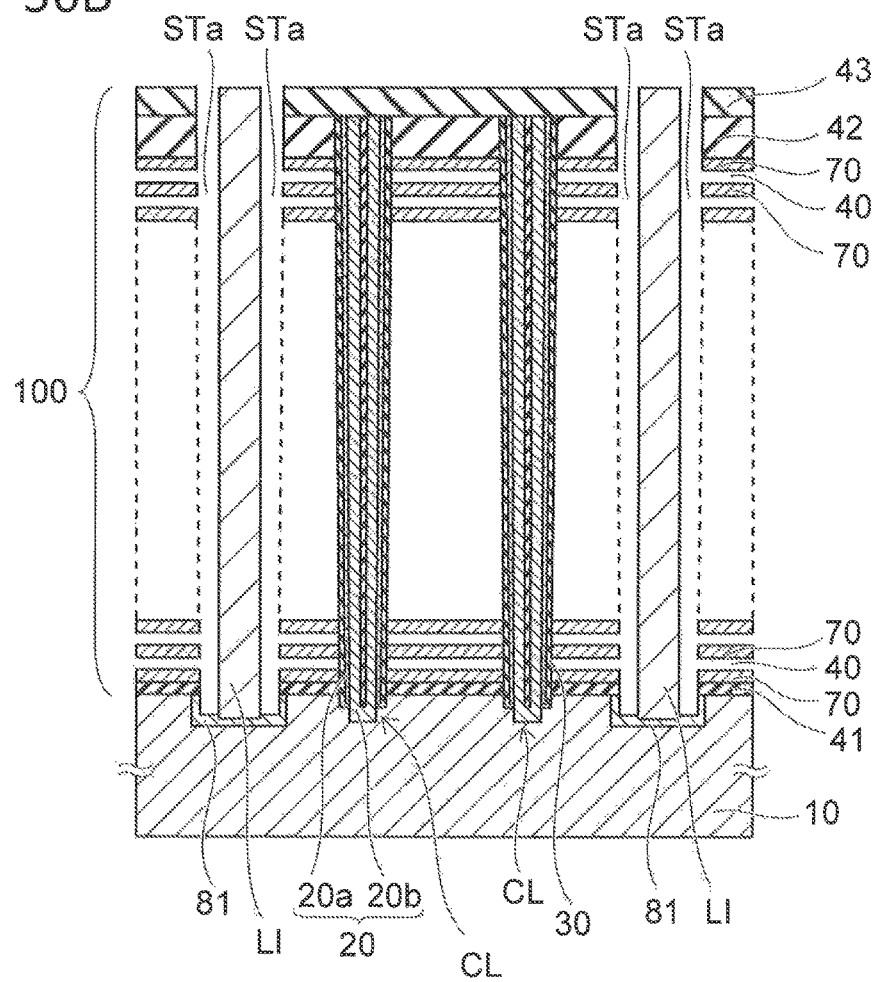
FIG. 30B is a cross sectional view taken along A-A' in FIG. 30A.

FIG. 30B is a cross sectional view taken along A-A' in FIG. 30A.

For instance, the sacrificial film 72 made of silicon oxide film is removed by an etching solution containing hydrofluoric add. The cover film 110, the electrode film 70, the insulating films 41, 42, 43, and the substrate 10 are left without being etched.

After the air gap 40 is formed, as shown in FIG. 19, an insulating film 47 having low coverage is formed on the cover film 110 and on the insulating film 43. The upper end of the slit STa is occluded with a part of the insulating film 47.

Next, third to fifth embodiments are described. The third to fifth embodiments are applicable to both the first embodiment and the second embodiment described above.

Figure 31:
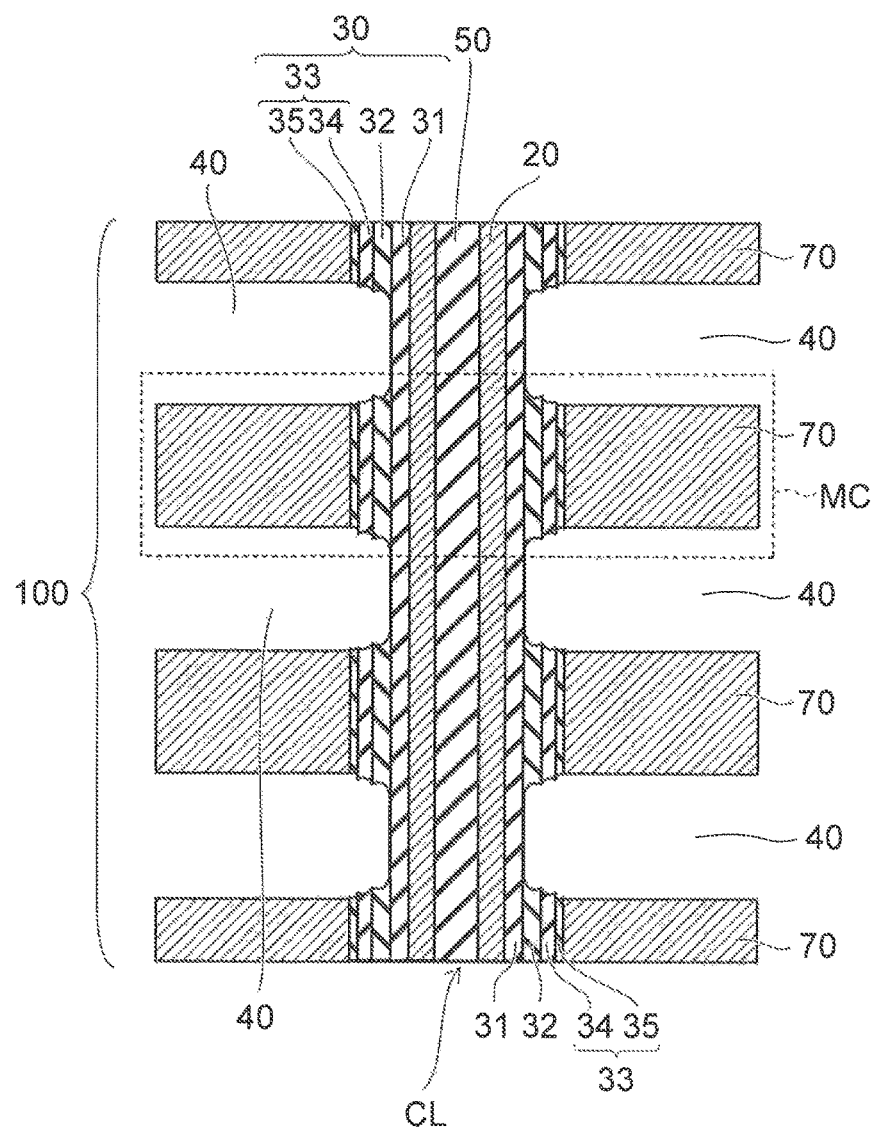
FIG. 31 is a schematic sectional view of a semiconductor device of a third embodiment.

FIG. 31 is a schematic sectional view of a memory cell MC of a semiconductor device of the third embodiment.

The block insulating film 33 and the charge storage film 32 are not continued but separated in the stacking direction of the stacked body 100. The tunnel insulating film 31, the semiconductor film 20, and the core film 50 extend continuously in the stacking direction.

The block insulating film 33 and the charge storage film 32 are provided between the electrode film 70 and the tunnel insulating film 31. The block insulating film 33 and the charge storage film 32 are not provided between the tunnel insulating film 31 and the air gap 40 between the electrode films 70. The air gap 40 extends to the tunnel insulating film 31.

The charge storage films 32 are separated in the stacking direction. Thus, the charge stored in the charge storage film 32 is not released in the stacking direction. Accordingly, the memory cell MC is superior in charge retention characteristics.

The air gap 40 is formed by etching the sacrificial film between the electrode films 70. After the sacrificial film is etched and removed, the second block film 35 is exposed to the air gap 40. The second block film 35 is etched by an etching solution supplied through the slit ST (or STa) and the air gap 40.

By the etching of the second block film 35, the second block film 35 is divided in the stacking direction. Thus, the first block film 34 is exposed to the air gap 40. The first block film 34 is etched by an etching solution supplied through the slit ST (or STa) and the air gap 40.

By the etching of the first block film 34, the first block film 34 is divided in the stacking direction. Thus, the charge storage film 32 is exposed to the air gap 40. The charge storage film 32 is etched by an etching solution supplied through the slit ST (or STa) and the air gap 40. Thus, the charge storage film 32 is divided in the stacking direction.

By the etching of the block insulating film 33 and the charge storage film 32, the side surface of the memory film 30 opposed to the air gap 40 is set back to the semiconductor film 20 side.

Thus, the creepage distance between the vertically adjacent electrode films 70 along the surface of the memory film 30 adjacent to the air gap 40 is made larger than the spacing between the vertically adjacent electrode films 70. This prevents short circuit through the surface of the memory film 30 between the vertically adjacent electrode films 70.

Figure 32:
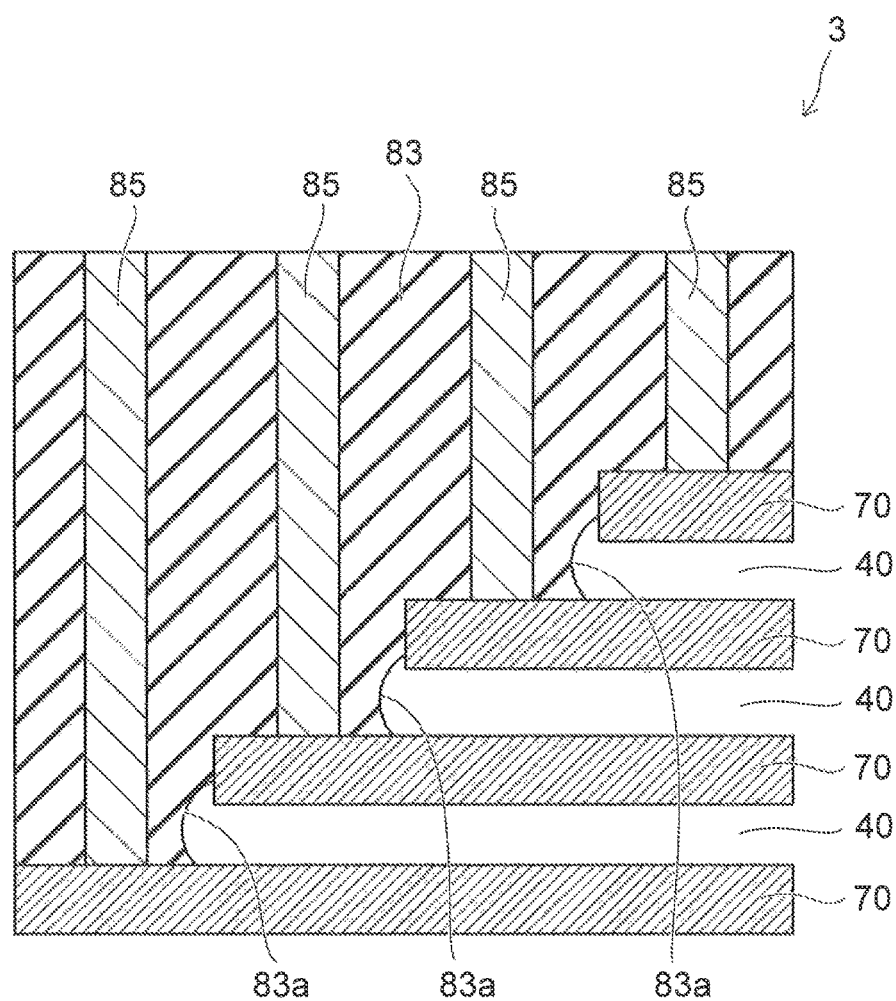
FIG. 32 is a schematic sectional view of a semiconductor device of a fourth embodiment.

FIG. 32 is a schematic sectional view of a staircase section 3 of a semiconductor device of the fourth embodiment.

The staircase section 3 is provided in the region outside the aforementioned memory cell array 1 (or 2). The memory cell array 1 (or 2) and the staircase section 3 are provided on the same substrate 10.

The staircase section 3 also includes a plurality of electrode films 70 stacked via the air gap 40. The staircase section 3 is provided in e.g. the X-direction end parts of the electrode films 70 of the memory cell array 1 shown in FIG. 1 or the memory cell array 2 shown in FIG. 18. The end parts of the electrode films 70 are formed in a staircase shape in the staircase section 3.

An insulating film 83 covers the staircase-shaped end part of the electrode films 70. A plurality of contact vias 85 are provided in the staircase section 3. Each contact via 85 penetrates through the insulating film 83 to the electrode film 70 of the corresponding stage.

The contact via 85 is formed from a conductive film containing metal. Each contact via 85 is electrically connected to the electrode film 70 of the corresponding stage. Each contact via 85 is connected to the upper interconnect, not shown, provided on the insulating film 83.

Each electrode film 70 of the staircase section 3 is connected integrally to the corresponding electrode film 70 of the memory cell array 1 (or 2). Thus, the electrode film 70 of the memory cell array 1 (or 2) is connected to the upper interconnect through the contact via 85 of the staircase section 3. The upper interconnect is connected to e.g. a control circuit formed on the surface of the substrate 10. The control circuit controls the operation of the memory cell array 1 (or 2).

During or after the etching for forming the air gap 40, the surface 83a of the insulating film 83 adjacent to the air gap 40 is also etched. The surface 83a of the insulating film 83 is isotropically etched by an etching solution. By this etching, the surface 83a of the insulating film 83 adjacent to the air gap 40 is set back in the direction away from the staircase-shaped end of the electrode film 70.

Thus, the creepage distance between the vertically adjacent electrode films 70 along the surface 83a of the insulating film 83 adjacent to the air gap 40 is made larger than the spacing between the vertically adjacent electrode films 70. This prevents short circuit through the surface 83a of the insulating film 83 between the vertically adjacent electrode films 70.

Figure 33:
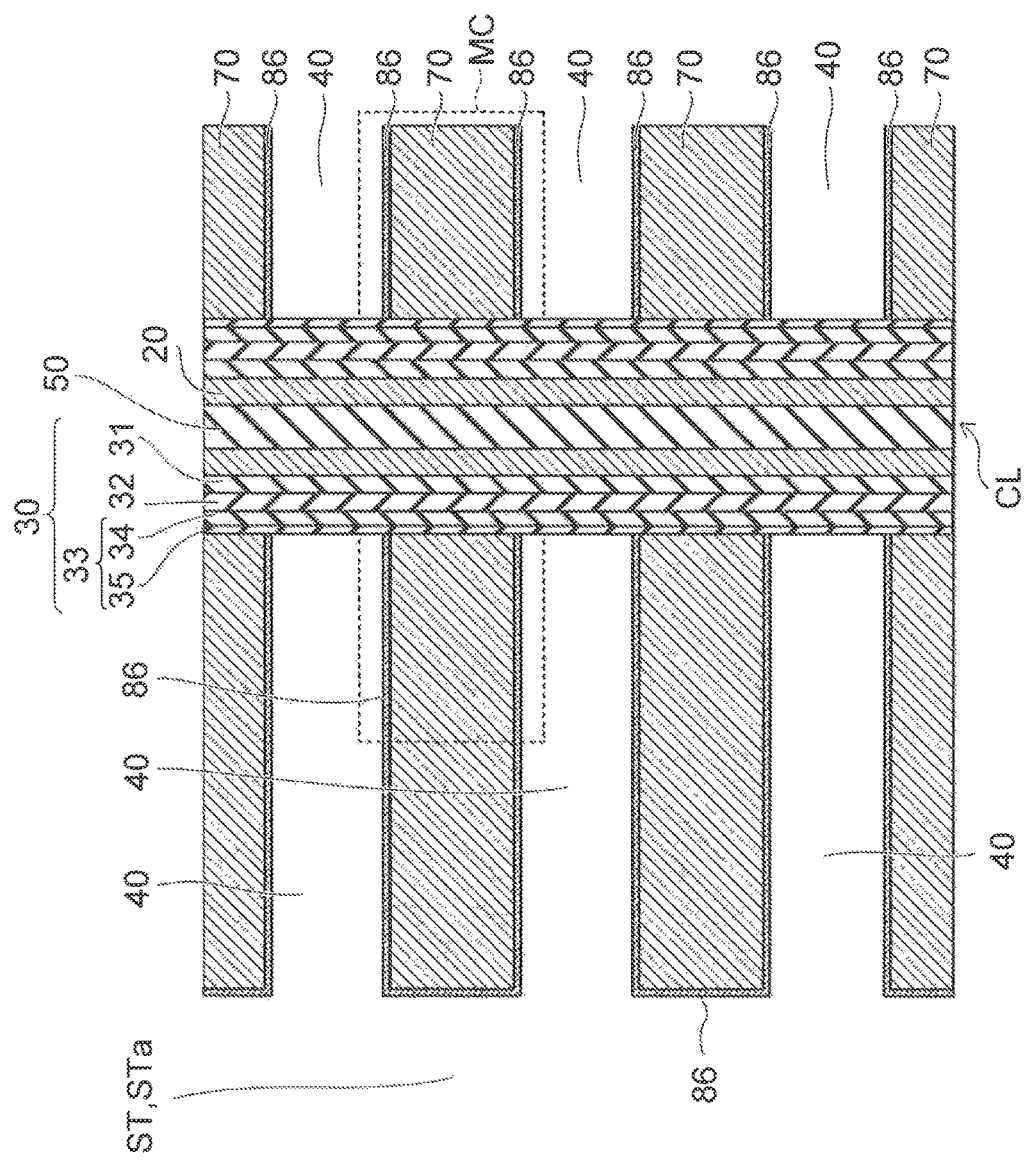
FIG. 33 is a schematic sectional view of a semiconductor device of a fifth embodiment.

FIG. 33 is a schematic sectional view of a memory cell MC of a semiconductor device of the fifth embodiment.

A protective film 86 made of a material different from that of the electrode film 70 is provided on the surface of the electrode film 70 opposed to the air gap 40 and the slit ST (or STa).

The protective film 86 is insulative or hydrophobic. Such a protective film 86 prevents short circuit between the electrode films 70 opposed across the air gap 40, or short circuit between the interconnect part LI shown in FIG. 19 and the electrode film 70. Furthermore, the protective film 86 protects the surface of the electrode film 70 from corrosion and oxidation.

The protective film 86 is e.g. a silicon oxide film. Alternatively, the surface of the electrode film 70 is hydrophobized using e.g. hydrocarbon or fluorocarbon, and the protective film 86 includes e.g. at least one of carbon, fluorine, and hydrogen. Alternatively, the protective film 86 includes titanium. Titanium is superior in moisture absorption and oxygen absorption. The protective film 86 containing titanium reduces humidity and oxygen concentration in the air gap 40. This prevents short circuit between the electrode films 70 through moisture, and oxidation of the surface of the electrode film 70.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a substrate;
   a stacked body provided above the substrate and including a plurality of electrode films stacked via a first air gap;
   a second air gap penetrating through the electrode films in a stacking direction of the stacked body, the stacked body being separated into a plurality of blocks in a first direction crossing the stacking direction by the second air gap, and the second air gap communicating with the first air gap;
   a first insulating film provided above the stacked body and covering an upper end of the second air gap;
   a semiconductor film extending in the stacking direction in the stacked body;
   a stacked film including a charge storage portion, the stacked film being provided between a side surface of one of the electrode films and a side surface of the semiconductor film opposed to the side surface of the one of the electrode films, and the stacked film being in contact with the side surface of the one of the electrode films and the side surface of the semiconductor film;
   a second insulating film covering staircase-shaped end parts of the electrode films; and
   a plurality of contact vias extending in the stacking direction through the second insulating film to the staircase-shaped end parts of the electrode films,
   a creepage distance between the electrode films along a surface of the second insulating film adjacent to the first air gap being larger than a spacing between the electrode films adjacent in the stacking direction,
   the staircase-shaped end parts having portions on which the contact vias are disposed,
   upper horizontal surfaces of the portions of the staircase-shaped end parts being directly covered with the second insulating film without the first air gap interposed between the upper horizontal surfaces of the portions of the staircase-shaped end parts and the second insulating film.

2. The device according to claim 1, wherein the stacked film includes an insulating film provided between the charge storage portion and the semiconductor film, being in contact with the side surface of the semiconductor film, and extending in the stacking direction.

3. The device according to claim 1, wherein the side surface of the semiconductor film is covered with the stacked film and not exposed to the first air gap.

4. The device according to claim 1, wherein a spacing between the electrode films opposed in the first direction across the second air gap is larger than a spacing between the electrode films adjacent in the stacking direction via the first air gap.

5. The device according to claim 1, wherein the second air gap extends above an upper surface of an uppermost electrode film of the electrode films.

6. The device according to claim 5, wherein a creepage distance along a surface of the first insulating film between the uppermost electrode films opposed across the second air gap is larger than a width in the first direction of the second air gap.

7. The device according to claim 1, wherein the electrode films includes a first electrode film functioning a control gate of a memory cell, a second electrode film functioning a control gate of a drain side select transistor, and a third electrode film functioning a control gate of a source side select transistor, and the second air gap penetrates through the first electrode film, the second electrode film, and the third electrode film in the stacking direction.

* * * * *